United States Patent [19]

Tagami et al.

[11] Patent Number: 5,617,478
[45] Date of Patent: Apr. 1, 1997

[54] SOUND REPRODUCTION SYSTEM AND A SOUND REPRODUCTION METHOD

[75] Inventors: Ryou Tagami, Hirakata; Takeshi Norimatsu, Kadoma; Masaharu Matsumoto, Katano; Mikio Oda, Yawata; Mitsuhiko Serikawa, Nishinomiya; Akihisa Kawamura, Hirakata; Hiroko Numazu, Kadoma, all of Japan

[73] Assignee: Matsushita Electric Industrial Co., Ltd., Kadoma, Japan

[21] Appl. No.: 225,602

[22] Filed: Apr. 11, 1994

[51] Int. Cl.⁶ ............................ H04R 29/00; H03G 3/00
[52] U.S. Cl. ............................ 381/56; 381/63; 381/103; 395/2.17; 395/2.23; 395/2.67
[58] Field of Search ............................ 381/1, 17, 18, 381/61, 63, 56, 49, 51–53, 86, 102, 103, 104; 395/2.1, 2.16–0.19, 2.7, 2.77, 2.34, 2.23

[56] References Cited

U.S. PATENT DOCUMENTS

| | | | |
|---|---|---|---|
| 4,751,739 | 6/1988 | Serikawa et al. | 381/103 |
| 4,926,484 | 5/1990 | Nakano | 395/2.23 |
| 5,027,409 | 6/1991 | Sakamoto | 395/2.77 |
| 5,073,942 | 12/1991 | Yoshida et al. | 381/63 |
| 5,138,665 | 8/1992 | Ito | 381/101 |
| 5,148,484 | 9/1992 | Kane et al. | 381/56 |
| 5,375,188 | 12/1994 | Serikawa et al. | 381/11 |
| 5,381,482 | 1/1995 | Matsumoto et al. | 381/63 |
| 5,544,248 | 8/1996 | Date | 381/56 |

FOREIGN PATENT DOCUMENTS

| | | |
|---|---|---|
| 0412725 | 2/1991 | European Pat. Off. |
| 3-163999 | 7/1991 | Japan |

*Primary Examiner*—Curtis Kuntz
*Assistant Examiner*—Xu Mei
*Attorney, Agent, or Firm*—Ratner & Prestia

[57] ABSTRACT

A sound reproduction system for automatically conducting a tone control for an audio signal according to the present invention includes: an input terminal for inputting an audio signal; a judgment circuit for determining a ratio between a stereophonic signal component and a monophonic signal component of the input audio signal and for outputting a judgment signal; a signal processing section for receiving the input audio signal and processing the input audio signal so as to generate an output signal having uniform transmission characteristics irrespective of the listening position; an adder for receiving the input audio signal and the output signal and for adding the input audio signal with the output signal at a certain addition ratio based on the judgment signal so as to generate an added signal; and a loudspeaker for receiving the added signal and for reproducing the added signal in a plurality of positions.

2 Claims, 16 Drawing Sheets

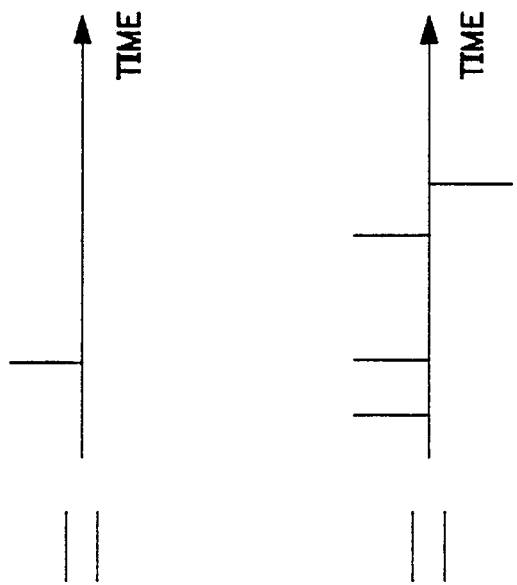
FIG. 12A
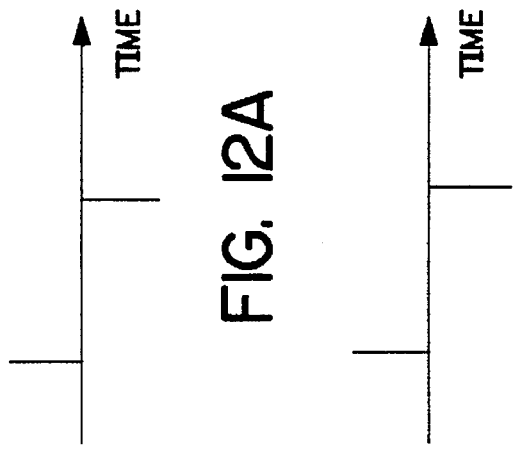
FIG. 12B
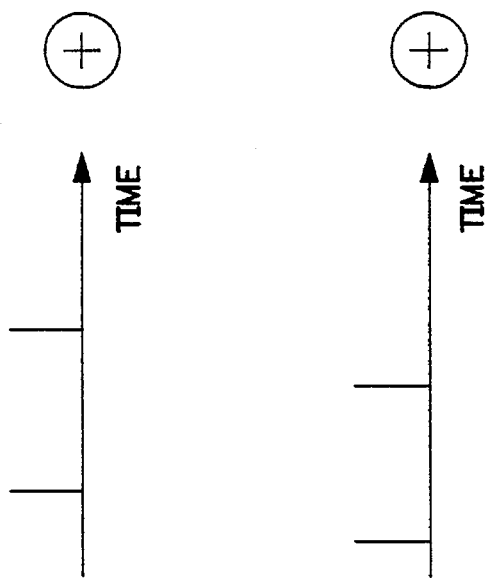

SOUND REPRODUCTION SYSTEM AND A SOUND REPRODUCTION METHOD

BACKGROUND OF THE INVENTION

1. Field of the Invention

The present invention relates to a sound reproduction system and a sound reproduction method to be used in a stereo audio system, a television system, etc. In particular, the present invention relates to a sound reproduction system capable of conducting an automatic tone control for an audio signal.

2. Description of the Related Art

In recent years, audio visual systems have made rapid progress, requiring high quality sound reproduction, as well as wider screens of display devices and high quality image reproduction. As the sizes of display devices increase, opportunities for several people to enjoy movies, music, etc. at the same time have increased. This has led to the need for a sound reproduction system having uniform acoustic characteristics irrespective of the listening position of each listener.

Conventional devices for realizing uniform sound reproduction are disclosed, for example, in Japanese Patent Application No. 1-203374. FIG. 10 shows an exemplary configuration for such a conventional sound reproduction system 700.

As is shown in FIG. 10, the sound reproduction system 700 includes audio signal input terminals 101, a signal processing section 703, an in-phase adder 107, an anti-phase adder 108, amplifiers 110, a left (L) -channel loudspeaker 111, and a right (R)-channel loudspeaker 112. The signal processing section 703 includes an adder 104 for summing up the right and left channel signals, a low-cut filter 105, and a group delayer 106. The low-cut filter 105 may be either a high-pass filter or a band-pass filter. The group delayer 106 is required to be an all pass filter which has stable frequency characteristics of amplitude, only the delay time of the group delayer 106 being variable depending on the frequencies.

Audio signals SL701 and SR701, which are input through the audio signal input terminal 101, are added up by the adder 104. The adder 104 outputs an audio signal S702. The low-cut filter 105 receives the audio signal S702 and allows only a predetermined band thereof to be output as an audio signal S703. The group delayer 106 receives the audio signal S703 and subjects the audio signal S703 to a group delaying process, so as to output an audio signal S704. The delayed audio signal S704 is supplied to the in-phase adder 107 and the anti-phase adder 108, so as to be added with the input audio signals SL701 and SR701, respectively. The in-phase adder 107 and the anti-phase adder 108 output audio signals SL705 and SR705, respectively, to the amplifiers 110 so as to be amplified thereby. The amplified audio signals SL705 and audio signal SR705 are reproduced by, respectively, the L-channel loudspeaker 111 and the R-channel loudspeaker 112.

FIGS. 13A and 13B show transmission characteristics of the audio signals reproduced by the sound reproduction system 700, with respect to listening positions of the listener. In FIG. 11, which shows the conditions for the measurements of the transmission characteristics shown in FIGS. 13A and 13B, W denotes the distance between the loudspeakers 111 and 112; M denotes the middle point between the loudspeakers 111 and 112; R denotes a distance between the middle point M and a measurement point $P_1$ or $P_2$; X denotes a center axis originated from the middle point M; and θ denotes an angle between the measurement point $P_1$ or $P_2$ and the center axis X.

FIGS. 13A and 13B each show transmission characteristics taken at a range of measurement points from $P_1$ (located on the center axis X; i.e. θ=0°) to $P_2$ (θ=30°), under the conditions that W=80 cm and R =240 cm. The input signals are monophonic signals. FIG. 13A shows the transmission characteristics when the input audio signals are not processed by the signal processing section 703. FIG. 13B shows the transmission characteristics when the input audio signals are processed by the signal processing section 703. As is seen from FIG. 13A, when the input audio signals are not processed by the signal processing section 703, the transmission characteristics have a large dip caused by the phase interference between the signals from the right loudspeaker 112 and the left loudspeaker 111. This is because the difference between the distances of the measurement point P, taken from the L-channel loudspeaker 111 and the R-channel loudspeaker 112, becomes larger as angle θ increases. This dip in the transmission characteristics can be corrected, as is shown in FIG. 13B, by processing the input audio signals in the signal processing section 703, and specifically by adding the delayed signals from the group delayer 106 to the input audio signals so as to be output from the loudspeakers 111 and 112.

FIGS. 12A and 12B schematically show impulse responses measured at $P_1$ and $P_2$, respectively. At each of the measurement points $P_1$ and $P_2$, respective impulse waveforms reproduced by the right loudspeaker 112 and the left loudspeaker 111 combined. As a result, the delayed signals cancel each other at $P_1$, while they function to compensate the distortion in the transmission characteristics at $P_2$. Thus, as is shown in FIG. 13B, uniform acoustic characteristics are realized irrespective of the listening position of a listener, as long as monophonic signals are reproduced by means of the right loudspeaker 112 and the left loudspeaker 111.

The performance of a sound reproduction system can be estimated with another factor: the articulation score, which indicates how clearly a reproduced voice can be heard by a listener.

FIGS. 14A and 14B each show monosyllable articulation scores examined in a range of measurement points from $P_1$ (θ=0°) to P2 (θ=30°), under the conditions that W=80 cm and R=240 cm. The input signals are monophonic voice signals. A monosyllable articulation score is defined as a percentage representing how many meaningless monosyllables that are clearly pronounced in a random sequence, e.g. "ka", "sha", "pa", "re", and so on , are accurately recognized by a listener, taken against the total number of such clearly pronounced monosyllables.

FIG. 14A shows the results obtained when the input audio signals are not processed by the signal processing section 703. FIG. 14B shows the results obtained when the input audio signals are processed by the signal processing section 703. As is seen from FIG. 14A, when the input audio signals are not processed by the signal processing section 703, the articulation score decreases as the listening position shifts from the center axis X. When the delayed signals from the group delayer 106 are added to the input audio signals, as is shown in FIG. 14B, a high articulation score is obtained irrespective of the listening positions.

As is described above, a uniform speech articulation score, irrespective of the listening positions, is realized by processing the input audio signals to compensate for a decrease in the speech articulation that occurs at a listening position offset from the center axis X. irrespective of the listening positions, in cases where the input audio signals are monophonic signals and are reproduced by means of right and left loudspeakers.

FIG. 15 shows a configuration for a conventional sound reproduction system 800 for conducting a tone control. The sound reproduction system 800 is to be used in a television system. A monitor system for reproducing image information is omitted in FIG. 15. An operation of the sound reproduction system 800 is described with reference to FIG. 15 below.

First, a broadcast wave is received by an antenna 404. An audio signal S801 is extracted in a decoder 405. A filter 801 adjusts the tone of the extracted audio signal S801 so as to output a signal S802. The signal S802 is reproduced by a loudspeaker 406. A listener (viewer) 407 switches a remote control switch 402 depending on the kind of broadcast wave. In accordance with the mode of the remote control switch 402 switched by the listener 407, a CPU 803 controls the filter 801 so as to have a corresponding pattern of amplitude-frequency characteristics. The filer 801 is usually referred to as a tone controller, or a bass/treble, which is a filter composed essentially of operational amplifiers and specific ICs for modifying the amplitude characteristics in low frequency bands or high frequency bands.

Each of FIGS. 16A to 16D shows amplitude-frequency characteristics of the filter 801, the vertical axis of the coordinates indicating amplitudes, and the horizontal axis indicating frequencies. Specifically, FIGS. 16A to 16D correspond to the respective frequency characteristic curves selected by means of the remote control switch 402. The characteristics curve C1 (FIG. 16A) shows amplitude-frequency characteristics in which the low frequency bands are boosted; the characteristics curve C2 (FIG. 16B) shows amplitude-frequency characteristics in which the low frequency bands are attenuated; the characteristics curve C3 (FIG. 16C) shows amplitude-frequency characteristics in which the high frequency bands are boosted; and the characteristics curve C4 (FIG. 16D) shows amplitude-frequency characteristics in which the high frequency bands are attenuated.

However, according to the conventional techniques described above, the listener is required to manually perform selective processing of an input audio signal, depending on whether the input audio signals are monophonic signals, stereophonic signals containing a monophonic signal component (i.e. a signal component located in the center), or completely stereophonic signals. The reason is that, according to the sound reproduction system 700 of the above-described configuration, a stereophonic input signal is also subjected to the same signal process that a monophonic signal is subjected to. The signal process conducted for the stereophonic signals, which is meant to realize uniform acoustic characteristics, results in distortion of the transmission characteristics, because of the phase interference between the signals reproduced from the right and left loudspeakers.

Further according to the conventional techniques, the listener is also required to manually perform a selective processing of an input audio signal in cases where the input audio signal contains a voice signal component. This is because the same signal process is conducted for the non-voice signal component as well as the voice signal, thereby disadvantageously letting the sound image be dispersed instead of compensating the distortion to increase the speech articulation as is intended.

Moreover, according to the sound reproduction system 800 of the above-described configuration, when tone control is conducted so as to boost and/or attenuate the low frequency bands or the high frequency bands as is shown in FIGS. 16A to 16D, not only the frequency characteristics but also the total sound volume of the input signal is changed. In order to conduct the tone control while maintaining the total sound volume of the input signal at the same level, it is necessary to adjust the total sound volume concurrently with the tone control. In addition, the tone control can only be achieved by a manual operation of the listener, which is conducted in accordance with the kind of broadcast wave by means of a remote control switch.

SUMMARY OF THE INVENTION

A sound reproduction system for automatically conducting a tone control for an audio signal according to the present invention comprises: input means for inputting an audio signal; judgment means for determining a ratio between a stereophonic signal component and a monophonic signal component of the input audio signal and for outputting a judgment signal; signal processing means for receiving the input audio signal and processing the input audio signal so as to generate an output signal having uniform transmission characteristics irrespective of the listening position; addition means for receiving the input audio signal and the output signal and for adding the input audio signal with the output signal at a certain addition ratio based on the judgment signal so as to generate an added signal; and signal outputting means for receiving the added signal and for reproducing the added signal in a plurality of positions.

In one embodiment of the invention, the addition means updates the addition ratio every time the judgment means outputs the judgment signal, the addition ratio being gradually increased or decreased from the value of a current addition ratio.

In another embodiment of the invention, the input audio signal includes at least a first channel signal and a second channel signal, and wherein the judgment means analyzes a correlation ratio between the first and the second channel signals at predetermined time intervals so as to determine the ratio between the stereophonic signal component and the monophonic signal component of the input audio signal based on the correlation ratio.

In still another embodiment of the invention, the input audio signal is an audio signal portion of a television broadcast signal, and wherein the judgment means determines whether the input audio signal is a stereophonic signal or a monophonic signal in accordance with a control signal in the television broadcast signal, the control signal indicating whether the television broadcast is a stereophonic broadcast or a monophonic broadcast.

In still another embodiment of the invention, the addition means updates the addition ratio every time the judgment means outputs the judgment signal, the addition ratio being gradually increased or decreased from a standard value which is a current addition ratio.

Alternatively, a sound reproduction system for automatically conducting a tone control for an audio signal according to the present invention comprises: input means for inputting an audio signal; judgment means for determining whether the input audio signal is a voice signal or a non-voice signal and for outputting a judgment signal; signal processing means for receiving the input audio signal and processing the input audio signal so as to generate an output signal having uniform speech articulation characteristics irrespective of the listening position; addition means for receiving the input audio signal and the output signal and for adding the input audio signal with the output signal at a certain addition ratio based on the judgment signal so as to generate an added signal; and signal outputting means for receiving the added signal and for reproducing the added signal in a plurality of positions.

In one embodiment of the invention, the judgment means detects a silent period in a predetermined time interval, and determines whether the input audio signal is a voice signal or a non-voice signal based on an occurrence frequency of the detected silent periods.

In another embodiment of the invention, the addition means updates the addition ratio every time the judgment means outputs the judgment signal, the addition ratio being gradually increased or decreased from a standard value which is a current addition ratio.

In still another embodiment of the invention, the signal processing means includes: first addition means for adding the first channel signal with the second signal and for generating a first added signal; filtering means for receiving the first added signal and for filtering the first added signal; delaying means for receiving a filtered signal output from the filtering means and for delaying the filtered signal by a predetermined amount of time so as to generate a delayed signal; second addition means for receiving the delayed signal and the first channel signal included in the input audio signal, for adding the delayed signal with the first channel signal so as to generate a second added signal, and for outputting the second added signal to the addition means; and third addition means for receiving the delayed signal and the second channel signal included in the input audio signal, for adding the delayed signal with the second channel signal so as to generate a third added signal, and for outputting the third added signal to the addition means.

In still another embodiment of the invention, the filtering means is a low-cut filter.

In still another embodiment of the invention, the second addition means adds the received signals in-phase, and the third addition means adds the received signal anti-phase.

In still another embodiment of the invention, the addition means has a first portion for adding the first channel signal with the second added signal, and a second portion for adding the second channel signal with the third added signal, and wherein the signal output means has a first output section for receiving a signal from the first portion of the addition means, and a second output section for receiving a signal from the second portion of the addition means.

Alternatively, a sound reproduction system for automatically conducting a sound volume adjustment for an audio signal according to the present invention comprises: input means for inputting an audio signal; tone control means for receiving the input audio signal and for adjusting amplitude-frequency characteristics of the input audio signal so as to output an output signal; sound volume adjustment means for receiving the output signal and for adjusting the sound volume of the output signal in accordance with a tone control conducted by the tone control means; and output means for receiving the output signal from the sound volume adjusting means and for reproducing the output signal, wherein the sound volume adjustment means adjusts the sound volume in such a manner that a perceived total sound volume of the output audio signal reproduced after being subjected to a tone control equals a perceived total sound volume of the output audio signal which is reproduced without being subjected to a tone control.

In one embodiment of the invention, the sound reproduction system further comprises control means for generating a control signal for controlling the tone control means and the sound volume adjustment means, wherein the tone control means adjusts amplitude-frequency characteristics of the input audio signal by using a selected one of a plurality of amplitude-frequency characteristics patterns in accordance with the control signal, and wherein the sound volume adjustment means adjusts the sound volume corresponding to the amplitude-frequency characteristics pattern used by the tone control means and in accordance with the control signal.

In another embodiment of the invention, the control means includes memory means for storing data of the plurality of amplitude-frequency characteristics patterns and data of sound volumes corresponding to the respective amplitude-frequency characteristics patterns.

Alternatively, a sound reproduction system for automatically conducting a tone control and a sound volume adjustment for an audio signal according to the present invention comprises: input means for inputting an audio signal; judging means for receiving the input audio signal and for determining whether the input audio signal is a voice signal or a non-voice signal so as to output a judgment signal; tone control means for adjusting amplitude-frequency characteristics of the input audio signal in accordance with a judgment result by the judgment means and for generating an output signal; sound volume adjustment means for receiving the output signal and for adjusting sound volume of the output signal in accordance with a tone control conducted by the tone control means; and output means for receiving the output signal from the sound volume adjusting means and for reproducing the output signal.

In one embodiment of the invention, the sound reproduction system further comprises control means for receiving the judgment signal and for generating a control signal for controlling the tone control means and the sound volume adjustment means, wherein the tone control means adjusts amplitude-frequency characteristics of the input audio signal by using a selected one of a plurality of amplitude-frequency characteristics patterns in accordance with the control signal, and wherein the sound volume adjustment means adjusts the sound volume of the output signal corresponding to the amplitude-frequency characteristics pattern used by the tone control means and in accordance with the control signal.

In another embodiment of the invention, the control means receives the judgment signal, controls the tone control means to gradually conduct a tone control at predetermined time intervals until receiving a next judgment signal, and controls the sound volume adjustment means to adjust the sound volume corresponding to respective gradual steps of the tone control.

In still another embodiment of the invention, the control means includes memory means for storing data of the plurality of amplitude-frequency characteristics patterns and data of sound volumes corresponding to the respective amplitude-frequency characteristics patterns.

In still another embodiment of the invention, the control means includes memory means for storing data of a first amplitude-frequency characteristics pattern for voice signals, a second amplitude-frequency characteristics pattern for non-voice signals, and a plurality of amplitude-frequency characteristics patterns gradually shifting from the first amplitude-frequency characteristics pattern to the second amplitude-frequency characteristics pattern, and data of sound volumes corresponding to the respective amplitude-frequency characteristics patterns.

In still another embodiment of the invention, the judgment means detects a silent period in a predetermined time interval, and determines whether the input audio signal is a voice signal or a non-voice signal based on an occurrence frequency of the detected silent periods.

A sound reproduction method for automatically conducting a tone control for an audio signal according to the present invention comprises the steps of: inputting an audio signal; judging the input audio signal so as to determine a ratio between a stereophonic signal component and a monophonic signal component of the input audio signal and outputting a judgment signal; processing the input audio signal so as to generate an output signal having uniform transmission characteristics irrespective of the listening position; adding the input audio signal with the output signal at a certain addition ratio based on the judgment signal so as to generate an added signal; and reproducing the added signal in a plurality of positions.

In one embodiment of the invention, the addition ratio is updated every time the judgment signal is output, the addition ratio being gradually increased or decreased from the value of a current addition ratio.

In another embodiment of the invention, the input audio signal includes at least a first channel signal and a second channel signal, and wherein the step of judging includes a step for analyzing a correlation ratio between the first and the second channel signals at predetermined time intervals so as to determine the ratio between the stereophonic signal component and the monophonic signal component of the input audio signal based on the correlation ratio.

In still another embodiment of the invention, the input audio signal is an audio signal portion of a television broadcast signal including a control signal indicating whether the television broadcast is a stereophonic broadcast or a monophonic broadcast, and wherein whether the input audio signal is a stereophonic signal or a monophonic signal is determined in accordance with the control signal in the television broadcast signal in the step of judging.

In still another embodiment of the invention, the addition ratio is updated every time the judgment signal is output, the addition ratio being gradually increased or decreased from a standard value which is a current addition ratio.

Alternatively, a sound reproduction method for automatically conducting a tone control for an audio signal, comprises the steps of: inputting an audio signal; judging the input audio signal so as to determine whether the input audio signal is a voice signal or a non-voice signal and for outputting a judgment signal; processing the input audio signal so as to generate an output signal having an uniform speech articulation characteristics irrespective of the listening position; adding the input audio signal with the output signal at a certain addition ratio based on the judgment signal so as to generate an added signal; and reproducing the added signal in a plurality of positions.

In one embodiment of the invention, the step of judging includes a step for detecting a silent period in a predetermined time interval so as to determine whether the input audio signal is a voice signal or a non-voice signal based on an occurrence frequency of the detected silent periods.

In another embodiment of the invention, the addition ratio is updated every time the judgment signal is output, the addition ratio being gradually increased or decreased from a standard value which is a current addition ratio.

In still another embodiment of the invention, the step of processing includes: step (a) for adding the first channel signal with the second signal so as to generate a first added signal; step (b) for filtering the first added signal; step (c) for delaying the filtered signal by a predetermined amount of time so as to generate a delayed signal; step (d) for adding the delayed signal with the first channel signal so as to generate a second added signal, and outputting the second added signal to the addition means; and step (e) for adding the delayed signal with the second channel signal so as to generate a third added signal, and outputting the third added signal.

In still another embodiment of the invention, in step (b) the first added signal is low-cut filtered.

In still another embodiment of the invention, in step (d) the received signals are added in-phase, and in step (e) the received signals are added anti-phase.

In still another embodiment of the invention, the adding step includes the steps of adding the first channel signal with the second added signal so as to output a first component signal, and adding the second channel signal with the third added signal so as to output a second component signal, and wherein in the step of outputting, the first component signal is output from a first output position and the second component signal is output from a second output position.

Alternatively, a sound reproduction method for automatically conducting a sound volume adjustment for an audio signal according to the present invention comprises the steps of: inputting an audio signal; tone-controlling the input audio signal by adjusting amplitude-frequency characteristics of the input audio signal and outputting an output signal; adjusting sound volume of the output signal in accordance with a tone control conducted by the tone-controlling step; and reproducing the output signal, wherein the step of adjusting the sound volume is conducted in such a manner that a perceived total sound volume of the output audio signal reproduced after being subjected to a tone control equals a perceived total sound volume of the output audio signal which is reproduced without being subjected to a tone control.

In one embodiment of the invention, the sound reproduction method further comprises the steps of generating a control signal for controlling the tone-controlling and the sound volume adjustment, wherein amplitude-frequency characteristics of the input audio signal are adjusted by using a selected one of a plurality of amplitude-frequency characteristics patterns in accordance with the control signal, and wherein the sound volume is adjusted corresponding to the amplitude-frequency characteristics pattern used in the tone-controlling step and in accordance with the control signal.

In another embodiment of the invention, the tone-controlling is conducted using data of the plurality of amplitude-frequency characteristics patterns and data of sound volumes corresponding to the respective amplitude-frequency characteristics patterns which are stored in memory means.

Alternatively, a sound reproduction method for automatically conducting a tone control and a sound volume adjustment for an audio signal according to the present invention comprises the steps of: inputting an audio signal; judging the input audio signal and determining whether the input audio signal is a voice signal or a non-voice signal so as to output a judgment signal; tone-controlling the input audio signal by adjusting amplitude-frequency characteristics of the input audio signal based on the judgment signal and generating an output signal; adjusting the sound volume of the output signal in accordance with a tone control conducted in the step of tone-controlling; and reproducing the output signal.

In one embodiment of the invention, the sound reproduction method further comprises the steps of generating a control signal to control the tone-controlling and the adjusting sound volume based on the judgment signal, wherein amplitude-frequency characteristics of the input audio signal are adjusted by using a selected one of a plurality of amplitude-frequency characteristics patterns in accordance with the control signal, and wherein the sound volume of the output signal is adjusted in accordance with the control signal and corresponding to the amplitude-frequency characteristics pattern used in the tone-controlling step.

In another embodiment of the invention, the tone-controlling is gradually conducted at predetermined time intervals until a next judgment signal is output, and the sound volume adjustment is conducted corresponding to respective gradual steps of the tone-controlling.

In still another embodiment of the invention, the tone-controlling is conducted using data of the plurality of amplitude-frequency characteristics patterns and data of sound volumes corresponding to the respective amplitude-frequency characteristics patterns which are stored in memory means.

In still another embodiment of the invention, the tone-controlling is conducted using data including; a first amplitude-frequency characteristics pattern for voice signals, a second amplitude-frequency characteristics pattern for non-voice signals, a plurality of amplitude-frequency characteristics patterns gradually shifting from the first amplitude-frequency characteristics pattern to the second amplitude-frequency characteristics pattern, and data of sound volumes corresponding to the respective amplitude-frequency characteristics patterns.

In still another embodiment of the invention, the step of judging includes a step for detecting a silent period in a predetermined time interval so as to determine whether the input audio signal is a voice signal or a non-voice signal based on an occurrence frequency of the detected silent periods.

Thus, the invention described herein makes possible the advantages of: (1) providing a sound reproduction system and a sound reproduction method for automatically conducting a signal process for realizing uniform transmission characteristics irrespective of the listening position of a listener, in cases where the input audio signals are monophonic signals and in cases where the input audio signals are stereophonic signals containing a monophonic signal component; (2) providing a sound reproduction system and a sound reproduction method for automatically conducting a signal process for realizing a uniform speech articulation in cases where the input audio signal contains a voice signal component; (3) providing a sound reproduction system and a sound reproduction method for conducting a tone control resulting in sounds having a smooth tone to the ears of a listener by controlling the total sound volume concurrently with the tone control; and (4) providing a sound reproduction system and a sound reproduction method for determining whether an input audio signal is a voice signal or a non-voice signal, conducting an optimum tone control for the kind of input audio signal, and controlling the total sound volume at the same time, thereby substantially eliminating changes in the total volume that result from the tone control, and automatically achieving an optimum tone control for the kind of input audio signal.

These and other advantages of the present invention will become apparent to those skilled in the art upon reading and understanding the following detailed description with reference to the accompanying figures.

BRIEF DESCRIPTION OF THE DRAWINGS

FIGS. 12A and 12B are schematic diagrams showing impulse responses at the measurement points shown in FIG. 11.

DESCRIPTION OF THE PREFERRED EMBODIMENTS

Hereinafter, the present invention will be described by way of examples, with reference to the accompanying drawings.

EXAMPLE 1

Figure 1:
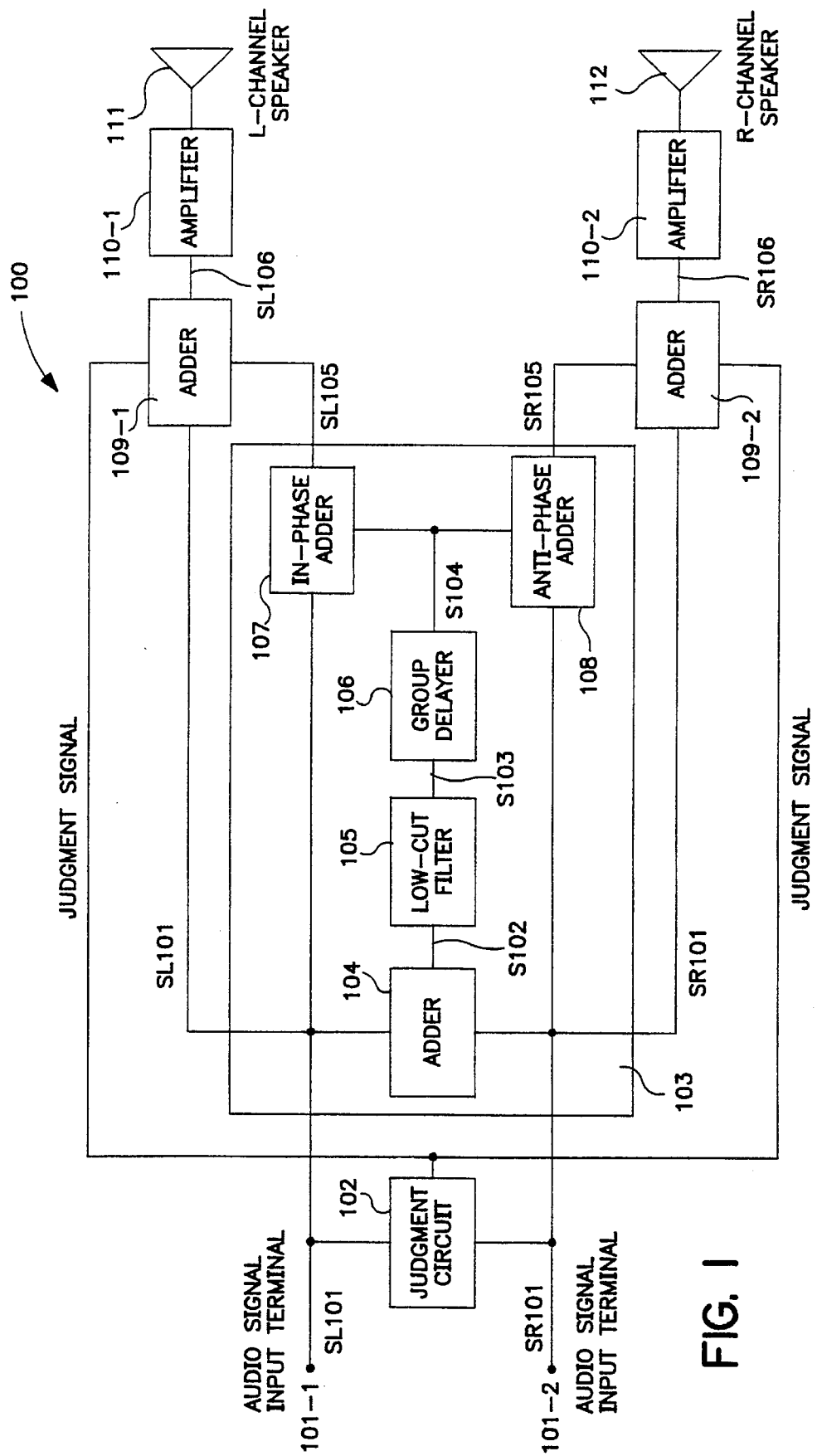
FIG. 1 is a diagram showing a configuration for a sound reproduction system according to a first example of the present invention.

FIG. 1 shows a configuration for a sound reproduction system 100 according to a first example of the present invention. As is shown in FIG. 1, the sound reproduction system 100 includes audio signal input terminals 101-1 and 101-2, a judgment circuit 102 for analyzing the ratio between a stereophonic signal component and a monophonic signal component included in an input audio signal, a signal processing section 103 for realizing uniform transmission characteristics irrespective of the listening position of a listener, adders 109-1 and 109-2, amplifiers 110-1 and 110-2, a left (L)-channel loudspeaker 111, and a right (R)-channel loudspeaker 112. The signal processing section 103 includes an adder 104 for adding signals that are input to the right and left channels, a low-cut filter 105, a group delayer 106, an in-phase adder 107, and an anti-phase adder 108. The low-cut filter 105 may be either a high-pass filter or a band-pass filter.

The group delayer 106 should be an all-pass filter which has stable frequency characteristics of amplitude, only the delay time of the group delayer 106 being variable depending on the frequencies. In the case of a television system such that the distance between the loudspeakers 111 and 112 is about 80 cm and the listening area ranges ±30° from the center line (axis), a high-pass filter having a cutoff frequency of about 250 Hz, and a band-pass filter having a passable band width of 250 Hz to 4 kHz may suitably be used as the low-cut filter 105.

An L-channel audio signal SL101 input through the audio signal input terminal 101-1, and an R-channel audio signal SR101 input through the audio signal input terminal 101-2 are input to the judgment circuit 102 and the signal processing section 103.

The audio signals SR101 and SL101, which are input through the audio signal input terminals 101-1 and 101-2, respectively, are summed by the adder 104. The adder 104 outputs the resultant added signal as a signal S102. The low-cut filter 105 receives the signal S102 and allows only a predetermined band thereof to be output as an audio signal S103. The group delayer 106 receives the audio signal S103 and subjects the audio signal S103 to a group delaying process, so as to output an audio signal S104. The delayed audio signal S104 is supplied to the in-phase adder 107 and the anti-phase adder 108, so as to be added with the input audio signals SL101 and SR101, respectively. The in-phase adder 107 outputs an audio signal SL105 to the adder 109-1. The anti-phase adder 108 outputs an audio signal SR105 to the adder 109-2.

On the other hand, each of the audio signals SR101 and SL101, which are input to the judgment circuit 102, is subjected to a correlation analysis by the judgment circuit 102, so as to obtain a ratio between a stereophonic signal component and a monophonic signal component included therein. The correlation analysis is conducted in accordance with Equation 1:

$$\alpha(t) = \frac{|SL101(t) - SR101(t)|}{|SL101(t) + SR101(t)|} \qquad :\text{Eq. 1}$$

In Equation 1, SL101(t) and SR101(t) denote respective amplitude levels of the input audio signals SR101 and SR101 at time t. The amplitude levels are obtained at predetermined time intervals (sampling time) Δt. The value of (α)t increases as the stereophonic signal component increases, and decreases as the monophonic signal component increases.

The above-described circuit for processing signals can be realized by those skilled in the art by using a usual technique. The judgment circuit 102 can be implemented by, in cases where an analog signal is input to the sound reproduction system 100, for example, operational amplifiers such as follows: an adder for summing the input audio signals SL101 and SR101, a subtracter for subtracting the input audio signal SR101 from the input audio signal SL101, and a comparator for comparing the added result with the subtracted result. It is also applicable to implement the judgment circuit 102 by using an analog/digital (A/D) convertor, so that the judgment circuit 102 conducts a digitalized signal judgment.

The adder 109-1 adds the input audio signal SL101 with the output signal SL105 of the signal processing section 103, in accordance with judgment result obtained by the judgment circuit 102, as is shown in Equation 2. Similarly, the adder 109-2 adds the input audio signal SR101 with the output signal SR105 from the signal processing section 103, in accordance with the judgment result obtained by judgment circuit 102, as is shown in Equations 2:

$$SL106 = \beta(t)SL101 + (1-\beta(t))SL105 \quad SR106 = \beta(t)SR101 + (1-\beta(t))SR105 \qquad :\text{Eq. 2}$$

In Equations 2, SL106 and SR106 denote respective output signals of the adders 109-1 and 109-2. β(t) and (1β(t)) are constants for keeping the total sound volume at a constant level. The constants β(t) and (1−β(t)) are therefore unnecessary in cases where the total sound volume is not required to be constant. β(t) may be any value in the range from 0 to 1. β(t) is a value representing the addition ratio of the input audio signal SL101 to the total signal SL106 when the input audio signal SL101 is added with the signal SL105 by the adder 109-1. β(t) is also a value representing the addition ratio of the input audio signal SR101 to the total signal SR106 when the input audio signal SR101 is added with the signal SR105 by the adder 109-2. β(t) is increased/decreased in accordance with the conditions shown by Equations 3:

$$\begin{aligned}
\text{When} \quad & \alpha(t) > \alpha(t - \Delta t), \\
& \beta(t) = \beta(t - \Delta t) + \Delta\beta \\
\text{When} \quad & \alpha(t) < \alpha(t - \Delta t), \\
& \beta(t) = \beta(t - \Delta t) - \Delta\beta \\
\text{When} \quad & \alpha(t) = \alpha(t - \Delta t), \\
& \beta(t) = \beta(t - \Delta t)
\end{aligned} \qquad :\text{Eq. 3}$$

In Equations 3, Δβ denotes a constant for gradually varying the addition ratio β(t) (as used in the adders 109-1 and 109-2) as a function of time. Specifically, if the value α(t) is larger than the value α(t−Δt), which is taken one sampling time (Δt) before the value α(t), it means an increase in the stereophonic signal component. Accordingly, the addition ratio β(t) in the adders 109-1 and 109-2 is so adjusted that the respective ratios of the input audio signals SL101 and SR101 are increased by an amount corresponding to Δβ. As a result, the stereophonic effect of the input audio signals SL101 and audio signal SL101 is reproduced more efficiently.

On the contrary, if the value α(t) is smaller than the value α(t−Δt), which is taken one sampling time (Δt) before the value α(t), it means an increase in the monophonic signal component. Accordingly, the addition ratio β(t) in the adders 109-1 and 109-2 is so adjusted that the respective addition ratios of the output signals SL105 and SR105 of the signal processing section 103 are increased. As a result, uniform transmission characteristics are achieved more effectively, irrespective of the listening position of the listener.

Moreover, by varying the value β(t) from the value β(t−Δt) in accordance with the increase/decrease of α(t) with respect to α(t−Δt), the addition ratios of the input audio signal and the processed output signal gradually change from their previous values. Therefore, even if a misjudgment is made, no noticeable error occurs. If any error occurs at all, it can be easily restored. Since the addition ratio is varied from the previous value, the change in the sound is perceived by the listener as a smooth one.

The adders 109-1 and 109-2 can be implemented by using mixing techniques for audio signals, e.g. by using an operational amplifier. By varying the resistance of the operational amplifier(s) based on the change in the value of the judgment signal α(t), the addition ratio β(t) can be varied. The desired control can be realized by setting the value of β(t) in accordance with a comparison result obtained by comparison between α(t) and α(t–t), as is shown in Equations 3, by using a micro computer (not shown), and if necessary an A/D convertor.

Then, the output signals SL106 and SR106 of the adders 109-1 and 109-2 are respectively amplified by the amplifiers 110-1 and 110-2 so as to be reproduced by the loudspeakers 111 and 112.

As is described above, by judging the ratio between the stereophonic signal component and the monophonic signal component in each of the input audio signals SL101 and SR101 by means of the judgment circuit 102, uniform transmission characteristics are automatically achieved for both a monophonic signal and a center signal component contained in a stereophonic signal, irrespective of the listening position of the listener. In addition, by gradually varying the addition ratios of the input audio signal and the processed output signal in accordance with the judgment result of the judgment circuit 102, any trouble arising due to misjudgment is minimized, while allowing the listener to recognize only a smooth change in the reproduced sound.

EXAMPLE 2

Figure 2:
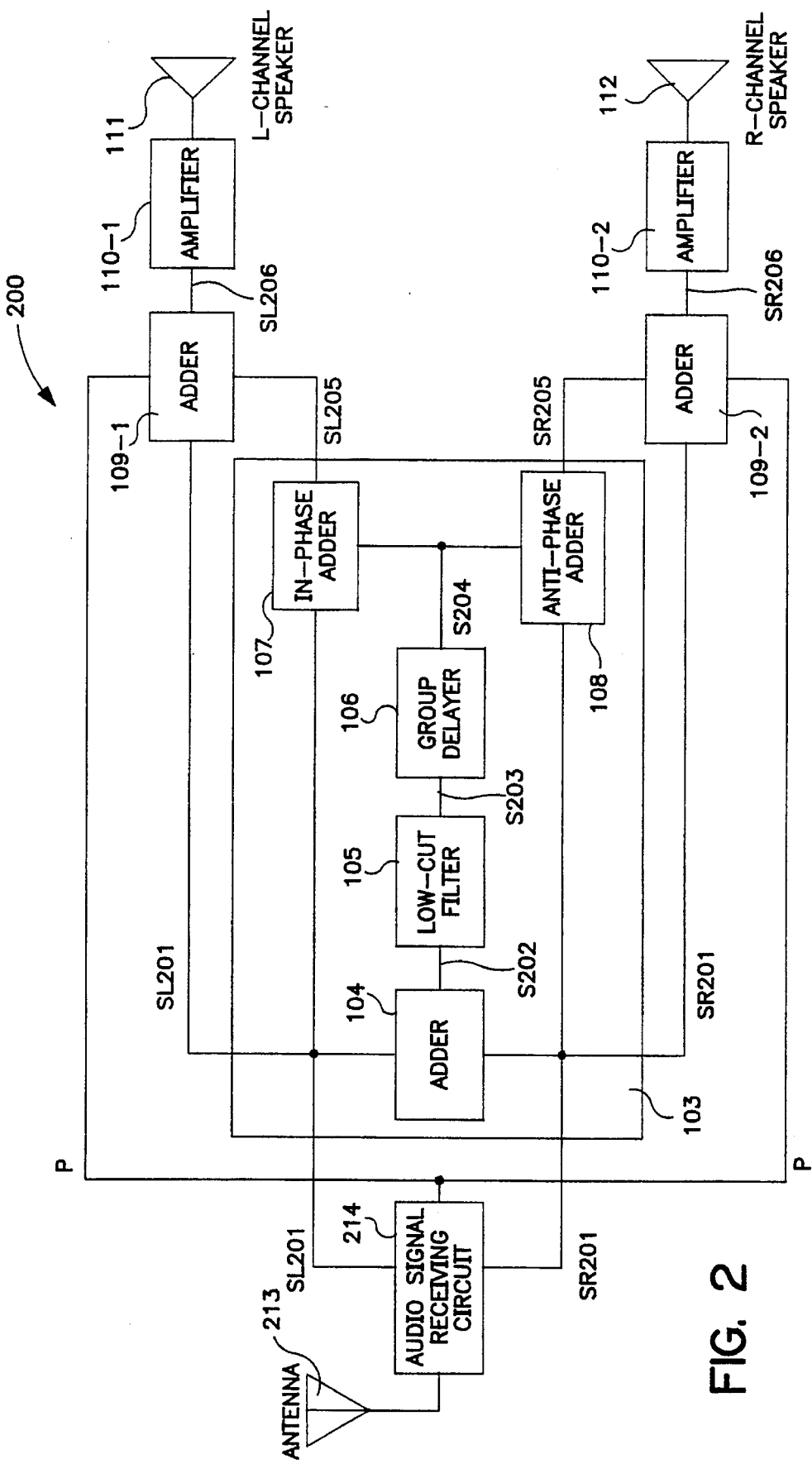
FIG. 2 is a diagram showing a configuration for a sound reproduction system according to a second example of the present invention.

FIG. 2 shows a configuration for a sound reproduction system 200 according to a second example of the present invention. As is shown in FIG. 2, the sound reproduction system 200 includes a television signal receiving antenna 213, an audio signal receiving circuit 214, a signal processing section 103, adders 109-1 and 109-2 for adding audio signals supplied from the audio signal receiving circuit 214 with output signals of the signal processing section 103, amplifiers 110-1 and 110-2, an L-channel loudspeaker 111, and an R-channel loudspeaker 112. The signal processing section 103, as is described in Example 1, includes an adder 104 for adding signals that are input to the right and left channels, a low-cut filter 105, a group delayer 106, an in-phase adder 107, and an anti-phase adder 108. A monitor system for reproducing image information from the television signal is omitted in FIG. 2.

An audio information component of a television signal received by the television antenna 213 is decoded by the audio signal receiving circuit 214 as an audio signal. An L-channel audio signal SL201 and an R-channel audio signal SR201 thus decoded are input to the signal processing section 103. The audio signal receiving circuit 214 further extracts a control signal P for judging whether the received broadcast wave is stereophonic or monophonic, and outputs the extracted control signal P to the adders 109-1 and 109-2. The control signal P may be, for example, a control signal which is currently used for determination of stereophonic/monophonic broadcasts in terrestrial television broadcasts and satellite broadcasts. The control signal P may be extracted by using a usual technique in TV signal reproduction.

The audio signals SR201 and SL201, which are input to the signal processor 103, are added up by the adder 104. The adder 104 outputs the resultant added signal as a signal S202. The low-cut filter 105 receives the signal S202 and allows only a predetermined band thereof to be output as an audio signal S203. The group delayer 106 receives the audio signal S203 and subjects the audio signal S203 to a group delaying process, so as to output a delayed audio signal S204. The delayed audio signal S204 is supplied to the in-phase adder 107 and the anti-phase adder 108, so as to be added with the input audio signals SL201 and SR201, respectively. The in-phase adder 107 outputs an audio signal SL205 to the adder 109-1. The anti-phase adder 108 outputs an audio signal SR205 to the adder 109-2.

On the other hand, the adder 109-1 adds the input audio signal SL201 with the output signal SL205 from the signal processor 103 based on the control signal P, in accordance with Equations 4. Similarly, the adder 109-2 adds the input audio signal SR201 with the output signal SR205 from the signal processing section 103 based on the control signal P, in accordance with Equations 4:

$$SL206=\beta(t)SL201+(1-\beta(t))SL205 \quad SR206=\beta(t)SR201+(1-\beta(t))SR205 \qquad :\text{Eq. 4}$$

In Equations 4, SL206 and SR206 denote respective output signals of the adders 109-1 and 109-2. β(t) and (1–β(t)) are constants for keeping the total sound volume at a constant level. The constants β(t) and (1–β(t)) are therefore unnecessary in cases where the total sound volume is not required to be constant. β(t) may be a value in the range from 0 to 1. β(t) is a value representing the addition ratio of the input audio signal SL201 to the total signal SL206 when the input audio signal SL201 is added with the audio signal SL205 by the adder 109-1. β(t) is also a value representing the addition ratio of the input audio signal SR201 to the total signal SR206 when the audio signal SR201 is added with the audio signal SR205 by the adder 109-2. The control signal P is extracted at predetermined time intervals (sampling time) Δt, and it is determined whether the input audio signal is a stereophonic signal or a monophonic signal based on the control signal P. If the input audio signal is determined to be a stereophonic signal, the value β(t) is varied in accordance with Equation 5 (shown below). If the input audio signal is determined to be a monophonic signal, the value β(t) is varied in accordance with Equation 6 (shown below).

In the case of a stereophonic signal;

$$\beta(t)=\beta(t-\Delta t)+\Delta\beta \qquad :\text{Eq. 5}$$

In the case of a monophonic signal;

$$\beta(t)=\beta(t-\Delta t)-\Delta\beta \qquad :\text{Eq. 6}$$

In Equations 5 and 6, Δβ denotes a constant for gradually varying the addition ratio β(t) (in the adders 109-1 and 109-2 as a function of time. Specifically, if the input audio signal is a stereophonic signal, the addition ratio β(t) in the adders 109-1 and 109-2 is so adjusted that the respective ratios of the input audio signals SL201 and SR201 are increased by an amount corresponding to Δβ. As a result, the stereophonic effect of the input audio signals SL201 and audio signal SR201 is reproduced more efficiently.

On the other hand, if the input audio signal is a monophonic signal, the addition ratio β(t) in the adders 109-1 and 109-2 is so adjusted that the respective ratios of the output signals SL205 and SR205 of the signal processing section 103 are increased. As a result, uniform transmission characteristics are achieved more effectively, irrespective of the listening position of the listener.

Moreover, by varying the value β(t) from the value β(t–Δt) in accordance with the control signal P, it is ensured that the addition ratios of the input audio signals and the processed output signals gradually change from their previous values. This allows the listener to recognize only a smooth change in the reproduced sound.

The adders 109-1 and 109-2 can be implemented by using mixing techniques for audio signals, e.g. by using an operational amplifier. By varying the resistance of the operational amplifier(s) based on the change in the value of the judgment signal α(t), the addition ratio β(t) can be varied. The desired control can be realized by setting the value of β(t) in accordance with a comparison result obtained by comparison between α(t) and α(t−Δt), as is shown in Equations 3, by using a micro computer (not shown), and if necessary an A/D convertor.

Then, the output signals SL206 and SR206 of the adders 109-1 and 109-2 are respectively amplified by the amplifiers 110-1 and 110-2 so as to be reproduced by the loudspeakers 111 and 112.

As is described above, by determining whether the input audio signals SL201 and SR202 are monophonic signals or stereophonic signals using the control signal P, the stereophonic effect of input audio signals is efficiently reproduced in cases where the input audio signals are stereophonic signals, and uniform transmission characteristics are automatically achieved irrespective of the listening position of the listener in cases where the input audio signals are monophonic signals, according to the present example. In addition, since the addition ratios of the input audio signals and the processed output signals are gradually varied in accordance with the judgment result, the listener is allowed to recognize only a smooth change in the reproduced sound.

EXAMPLE 3

Figure 3:
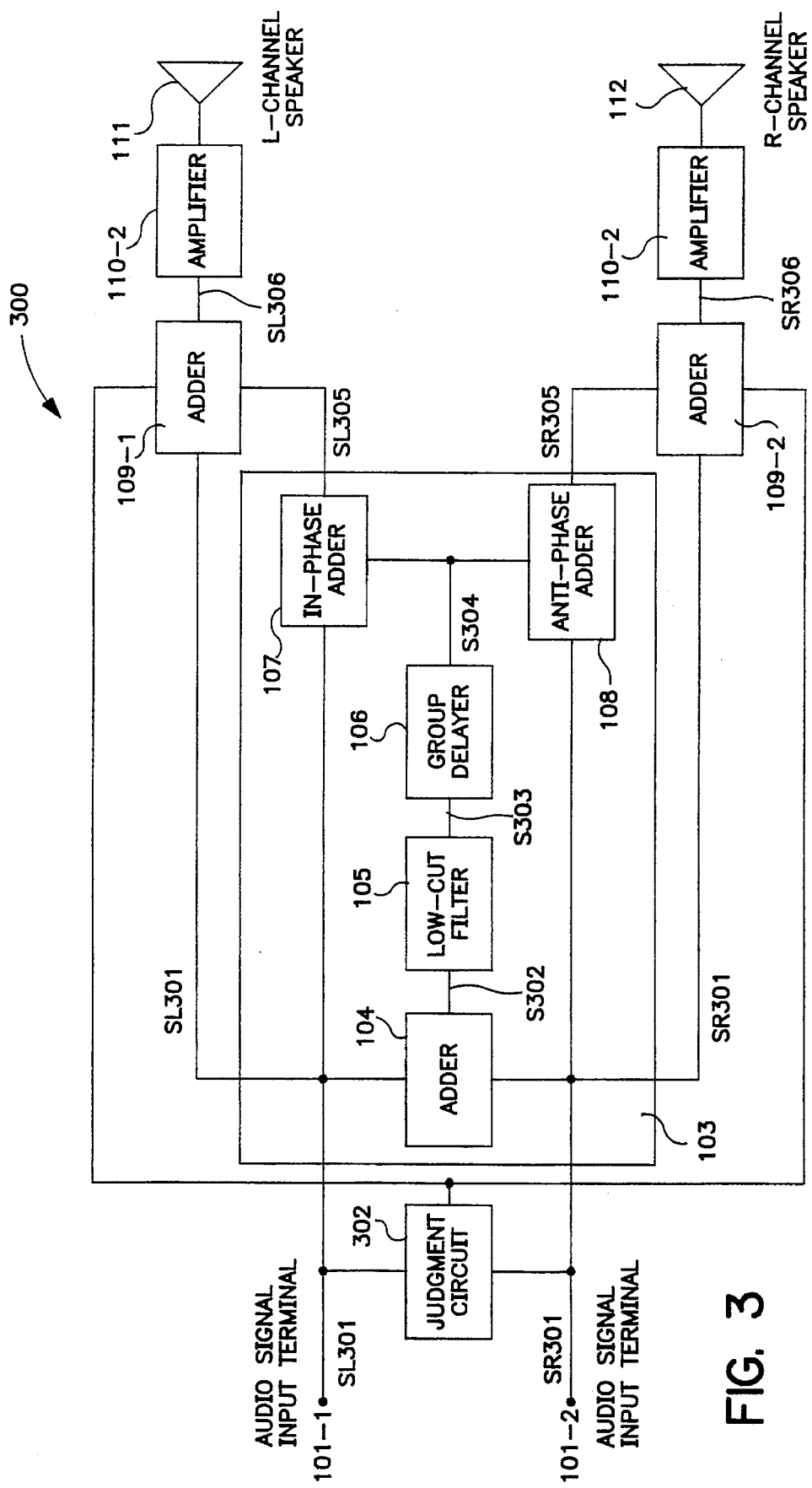
FIG. 3 is a diagram showing a configuration for a sound reproduction system according to a third example of the present invention.

FIG. 3 shows a configuration for a sound reproduction system 300 according to a third example of the present invention. As is shown in FIG. 3, the sound reproduction system 300 includes audio signal input terminals 101-1 and 101-2, a judgment circuit 302 for determining whether input audio signals are voice signals or non-voice signals, a signal processing section 103 for realizing uniform transmission characteristics irrespective of the listening position of a listener, adders 109-1 and 109-2 for adding the input audio signals with output signals of the signal processor 103, amplifiers 110-1 and 110-2, an L-channel loudspeaker 111, and an R-channel loudspeaker 112. The signal processing section 103 includes an adder 104 for adding the right and left input signals, a low-cut filter 105, a group delayer 106, an in-phase adder 107, and an anti-phase adder 108. The low-cut filter 105 may be either a high-pass filter or a band-pass filter.

An L-channel audio signal SL301 input through the audio signal input terminal 101-1, and an R-channel audio signal SR301 input through the audio signal input terminal 101-2 are input to the judgment circuit 302 and the signal processing section 103.

Then, the audio signals SR301 and SL301 are added up by the adder 104. The adder 104 outputs the resultant added signal as a signal S302. The low-cut filter 105 receives the signal S302 and allows only a predetermined band thereof to be output as an audio signal S303. The group delayer 106 receives the audio signal S303 and subjects the audio signal S303 to a group delaying process, so as to output an audio signal S304. The delayed audio signal S304 is supplied to the in-phase adder 107 and the anti-phase adder 108, so as to be added with the input audio signals SL301 and SR301, respectively. The in-phase adder 107 outputs an audio signal SL305 to the adder 109-1. The anti-phase adder 108 outputs an audio signal SR305 to the adder 109-2.

On the other hand, each of the audio signals SR301 and SL301 input to the judgment circuit 302 is subjected to a correlation and waveform analysis by the judgment circuit 302, so as to determine whether it is a voice signal or a non-voice signal. The determination is based on the occurrence frequency (or number) of silent periods in a predetermined time interval.

Figure 4:
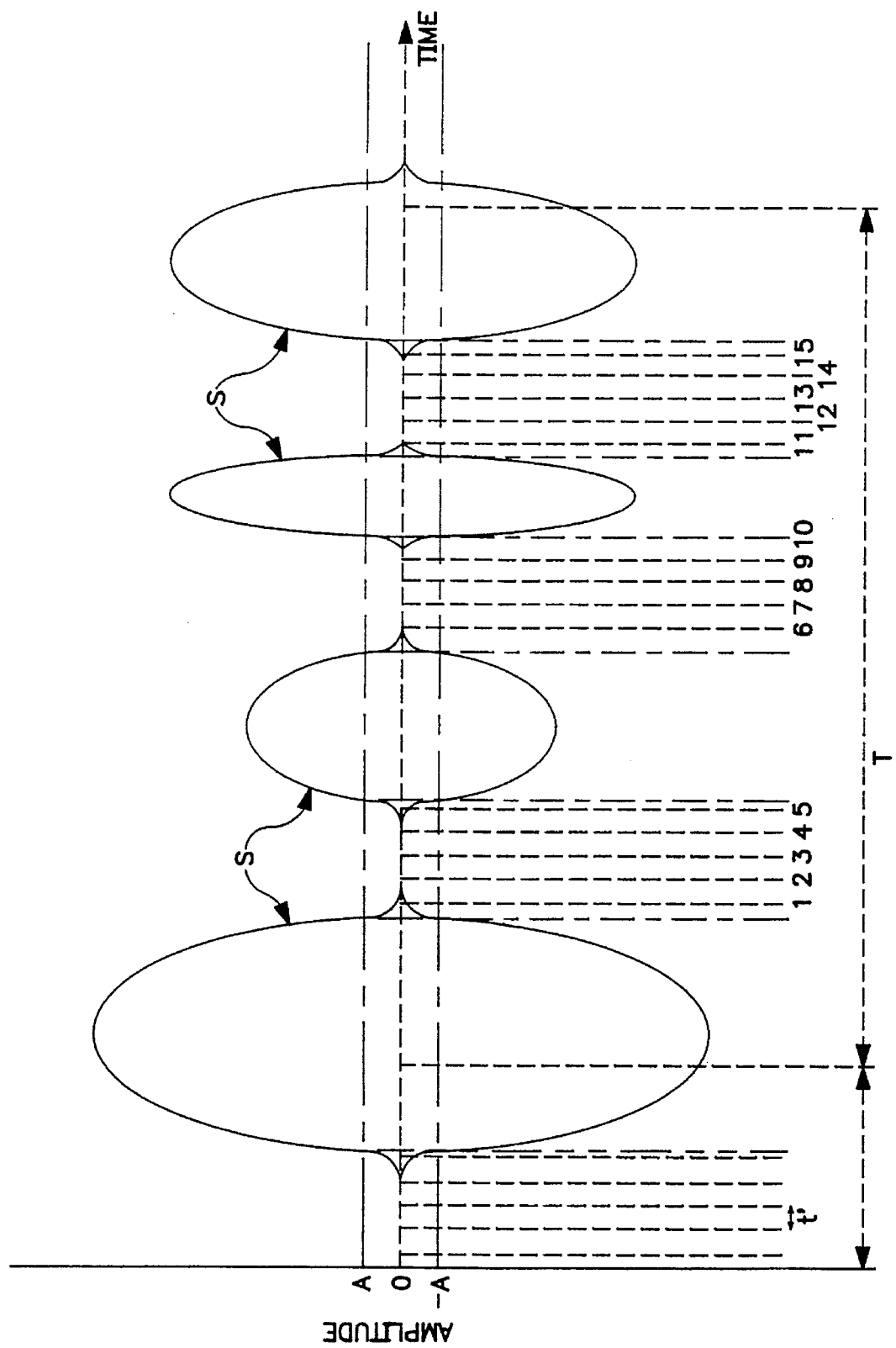
FIG. 4 is a diagram showing a waveform of an audio signal.

FIG. 4 is a graph showing silent periods of a voice signal, the vertical axis of the coordinates indicating amplitudes, and the horizontal axis indicating time. The voice signal is described with an envelope s. The silent periods are defined as periods in which the amplitude of the voice signal is smaller than a predetermined level A. The occurrence frequency is defined as the number of silent periods that have occurred in a time interval T. The time interval T should preferably be about 2 seconds, as is learned through experiments. The length of each silent period is counted by using a unit time interval t'. In FIG. 4, the numerals under the silent periods represent counting numbers indicating the lengths of the silent periods. Specifically, each number N denotes the cumulative number counted by the unit time interval t'. If the number N, taken at the end of the time interval T, is larger than a predetermined value, the audio signal is regarded as a voice signal; if such is not the case, the audio signal is regarded as a non-voice signal. This judgment is based on the fact that, when a speaking person inevitably takes breaths so that the resulting audio signal voice includes a number of silent periods during a certain time interval. In the examplary voice signal shown in FIG. 4, 3 silent periods each having 5 time intervals t have occurred during the time interval T.

In the case of broadcast signal, the signal may be an audio signal including a voice signal only, as in a news program for example, or may be an audio signal including voice signals and back ground (BG) signals of music and sound effects, as in a drama program for example. In the case of a drama program, the total signal level does not diminish to zero even when the voice signal is at zero level. Therefore, the predetermined amplitude level A (>0) is employed as a reference level in the judgment of silent periods. This allows an audio signal to be identified as a voice signal even when the signal level does not reach zero in the silent periods but is lower than the level A. By varying the amplitude level A, it is also made possible to raise/lower the criterion for judging whether the audio signal is a voice signal or not in accordance with the amount of the BG signal included in the audio signal.

The above-mentioned detection of silent periods and judgment as to whether the input audio signal is a voice signal or a non-voice signal conducted by the judgment circuit 302 can be achieved by using a microcomputer (not shown) and if necessary an A/D convertor.

The adders 109-1 add the input audio signal SL301 with the output signal SL305 of the signal processing section 103, based on the judgment result obtained by the judgment circuit 302, in accordance with Equations 7. Similarly, the adder 109-2 adds the input audio signal SR301 with the output signal SR305 from the signal processing section 103 based on the judgment result obtained by judgment circuit 302 in accordance with Equations 7:

$$SL306 = \beta(t)SL301 + (1-\beta(t))SL305 \quad SR306 = \beta(t)SR301 + (1-\beta(t))SR305 \qquad \text{:Eq. 7}$$

In Equations 7, SL306 and SR306 denote respective output signals of the adders 109-1 and 109-2. β(t) and (1−β(t)) are constants for keeping the total sound volume at a constant level. The constants β(t) and (1−β(t)) are therefore unnecessary in cases where the total sound volume is not required to be constant. β(t) may be any value in the range from 0 to 1. β(t) is a value representing the ratio of the input audio signals SL301 to the total signal SL306 when the input audio signal SL301 is added with the signal SL305 by the adder 109-1. β(t) is also a value representing the addition ratio of the input audio signal SR301 to the total signal SR306 when the input audio signal SR301 is added with the signal SR305 by the adder 109-2.

In the judgment circuit 302, the judgment as to whether the input audio signals are voice signals or non-voice signals is conducted at predetermined time intervals (sampling time) $T_1$. If the input audio signal is determined to be a non-voice signal, the value β(t) is varied in accordance with Equation 8 (shown below). If the input audio signal is determined to be a voice signal, the value β(t) is varied in accordance with Equation 9 (shown below).

In the case of a non-voice signal $$\beta(t)=\beta(t-\Delta t)+\Delta\beta \qquad :\text{Eq. 8}$$

In the case of a voice signal $$\beta(t)=\beta(t-\Delta t)-\Delta\beta \qquad :\text{Eq. 9}$$

In Equations 8 and 9, Δβ denotes a constant for gradually varying the addition ratio β(t) (in the adders 109-1 and 109-2) as a function of time. Specifically, if the input audio signal is determined to be a non-voice signal, the respective ratios of the input audio signals SL301 and SR301 are gradually increased in the adders 109-1 and 109-2. As a result, the stereophonic effect of the input audio signals SL301 and audio signal SR301 is reproduced more efficiently.

On the other hand, if the input audio signal is determined to be a voice signal, the respective addition ratios of the output signals SL305 and SR305 of the signal processing section 103 are gradually increased in the adders 109-1 and 109-2. As a result, uniform transmission characteristics are achieved with a good articulation, irrespective of the listening position of the listener.

Moreover, by gradually varying the value β(t) from the previous value, it is ensured that the addition ratios of the input audio signal and the processed output signal gradually change from their previous values. This allows the listener to recognize only a smooth change in the reproduced sound.

The adders 109-1 and 109-2 can be implemented in the same manner as in Examples 1 and 2. The control made in accordance with Equations 7 to 9 can be realized by using a microcomputer (not shown) and if necessary an A/D convertor.

Then, the output signals SL306 and SR306 of the adders 109-1 and 109-2, respectively, are amplified by the amplifiers 110-1 and 110-2 so as to be reproduced by the loudspeakers 111 and 112.

As is described above, by determining whether the input audio signals SL301 and SR302 are voice signals or non-voice signals in the judgment circuit 302, a uniform articulation is automatically achieved irrespective of the listening position of the listener. In addition, since the addition ratios of the input audio signals and the processed output signals are gradually varied in accordance with the judgment result, the listener is allowed to recognize only a smooth change in the reproduced sound even when a judgment error occurs.

EXAMPLE 4

Figure 5:
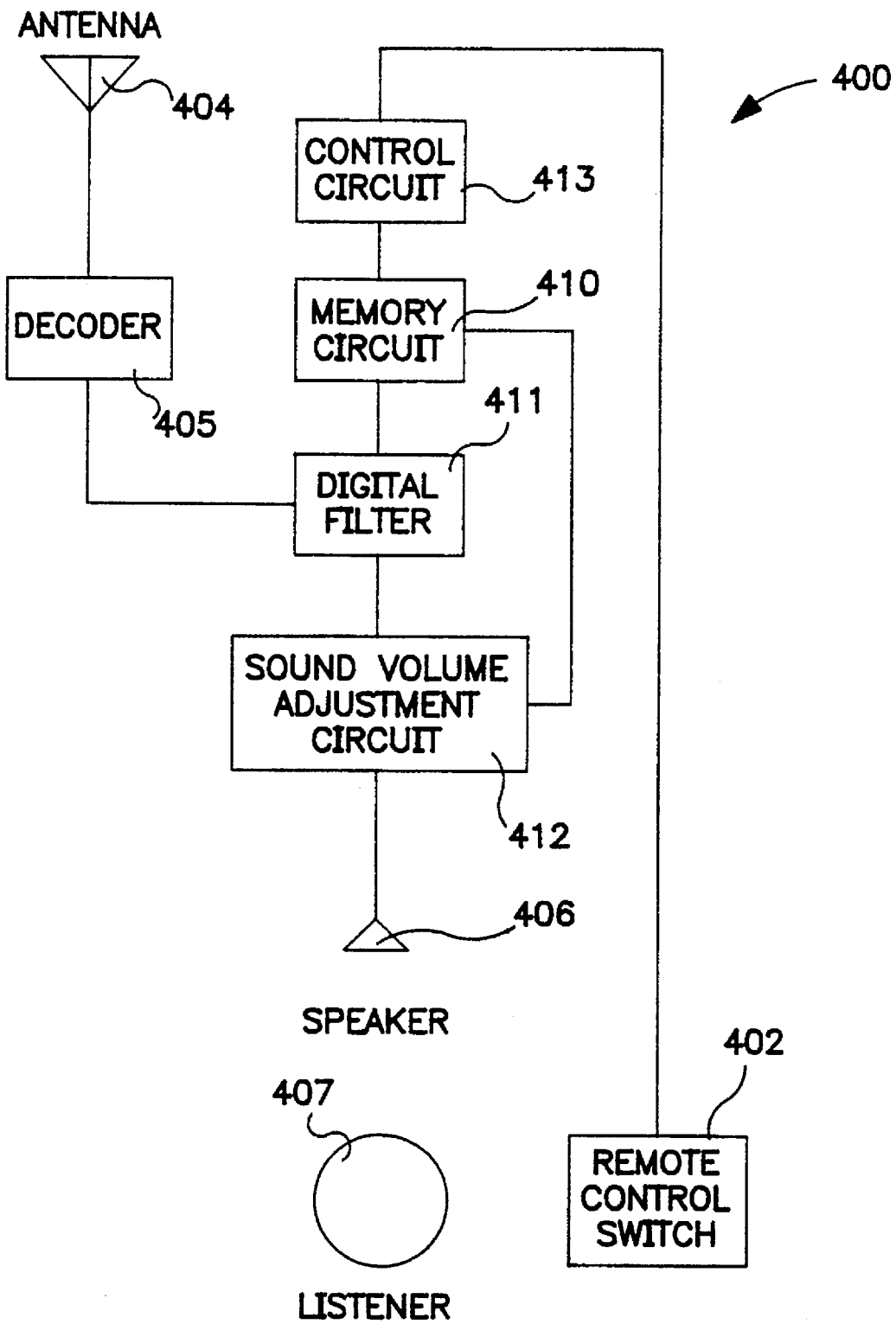
FIG. 5 is a diagram showing a configuration for a sound reproduction system according to a fourth example of the present invention.

FIG. 5 shows a configuration for a sound reproduction system 400 according to a fourth example of the present invention. As is shown in FIG. 5, the sound reproduction system 400 includes an antenna 404 for receiving a television broadcast wave, a decoder 405 for extracting an audio signal from the received broadcast wave, a digital filter 411, a sound volume adjustment circuit 412, a loudspeaker 406, a memory circuit 410, a control circuit 413, and a remote control switch 402 which a listener 407 uses for designating a tone pattern from outside the system. A monitor system for reproducing image information from the television signal is omitted in FIG. 5.

The memory circuit 410 stores a finite number (more than one) of amplitude-frequency characteristics patterns. The memory circuit 410 also stores sound volume data for each amplitude-frequency characteristics pattern, ensuring that a perceived sound volume of a given signal adjusted with a specific amplitude-frequency characteristics pattern (i.e. tone-controlled) becomes equal to a perceived sound volume of the signal without such tone control being conducted. The amplitude-frequency characteristics patterns and the corresponding sound volume data are stored in pairs in the memory circuit 410. These pairs of amplitude-frequency characteristics patterns and sound volume data can be obtained by measurements or by a simulation process.

A broadcast wave which is received by the antenna 404 is supplied to the decoder 405. The decoder 405 extracts an audio signal from the broadcast wave. The extracted audio signal is input to the digital filter 411. The digital filter 411 receives a specific amplitude-frequency characteristics pattern set by the listener 407 from the memory circuit 410, and conducts a tone control for the audio signal input from the decoder 405 in accordance with the specific amplitude-frequency characteristics pattern. The digital filter 411 can be implemented by an LSI such as a DSP (Digital Signal Processor).

The control circuit 413 controls the memory circuit 410 in accordance with the settings made by the remote control switch 402. The control circuit 413 sets a specific pattern in the digital filter 411, the specific pattern being selected from among the amplitude-frequency characteristics patterns stored in the memory circuit 410. At the same time, the control circuit 413 controls the memory circuit 410 to set the sound volume of the output signal from the sound volume adjustment circuit 412 in accordance with the sound volume data corresponding to the specific pattern which is set in the digital filter 411. The control circuit 413 and the memory circuit 410 may be implemented by a microcomputer and a memory, for example.

The digital filter 411 outputs a signal to the sound volume adjustment circuit 412. As is described above, in the sound volume adjustment 412, a sound volume corresponding to the amplitude-frequency characteristics pattern which is set in the digital filter 411 is set in accordance with the sound volume data supplied from the memory circuit 410. Thus, the output signal has been adjusted by the sound volume adjustment circuit 412 so as to have a sound volume which the listener 407 feels equal to the sound volume of the signal with no tone control being conducted. The signal output from the sound volume adjustment circuit 412 is reproduced by the loudspeaker 406 so as to be output to the outside as a sound.

The listener 407 selects, using the remote control switch 402, an amplitude-frequency characteristics pattern which was previously stored in the memory circuit 410 based on the kind of broadcast wave (i.e. whether it is a drama program consisting mainly of voice signals or a music program which contains substantially no voice signals), and/or the personal preferences. The control circuit 413 controls the memory circuit 410 in accordance with directions given by the remote control switch 402, and sets the specific amplitude-frequency characteristics pattern in the digital filter 411, and further sets the sound volume data in the sound volume adjustment circuit 412 so as to ensure that the perceived sound volume of the signal which is subjected to the tone control is equal to the sound volume of the signal without such tone control being conducted. As a result, the sound volume is automatically adjusted in accordance with the tone control so that the same sound volume is enjoyed by the listener 407 before and after the tone control. Therefore, even if the listener 407 adjusts the broadcast wave to a desired tone depending on the kind of broadcast wave, the listener 407 is not required to readjust the sound volume.

EXAMPLE 5

Figure 6:
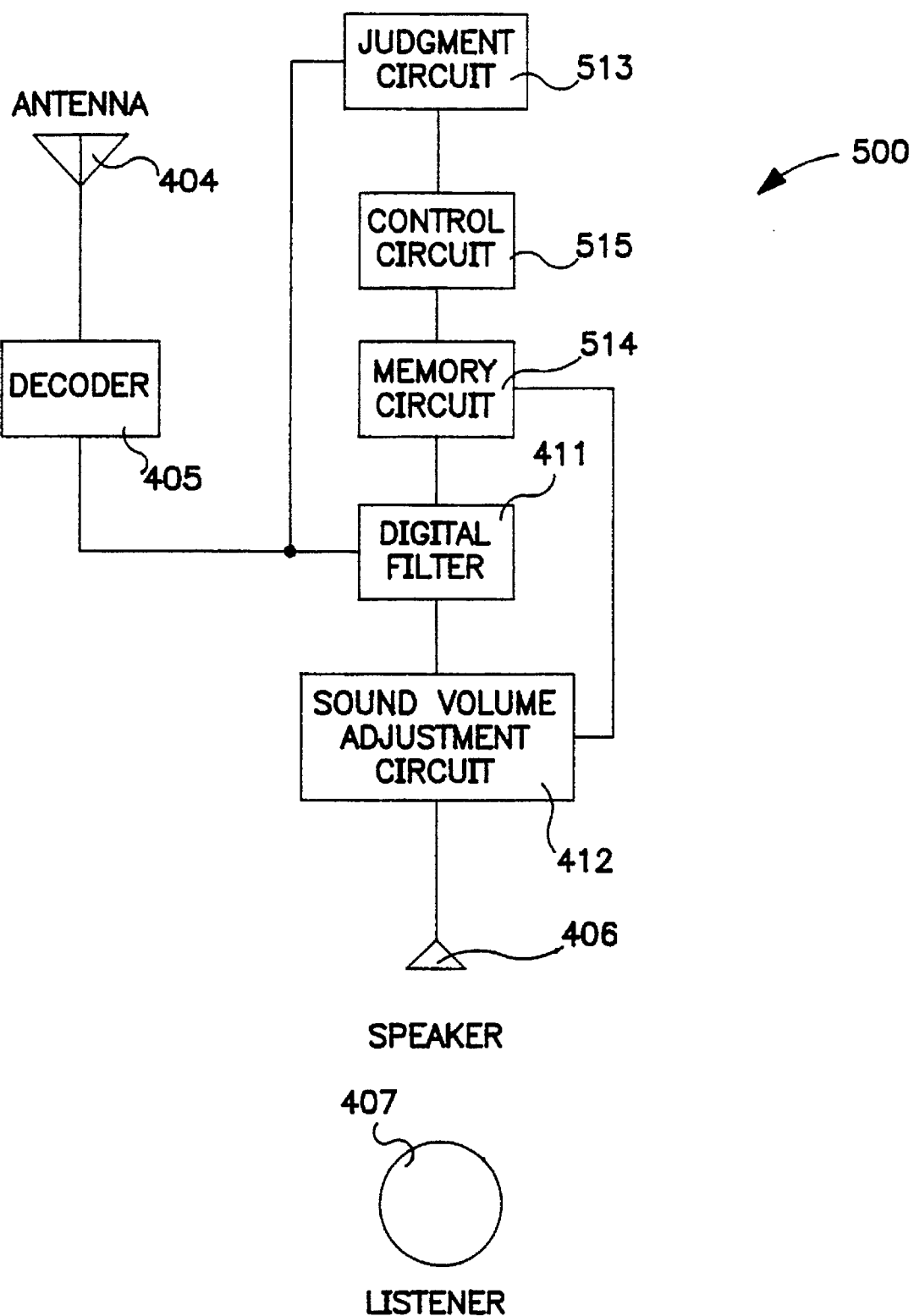
FIG. 6 is a diagram showing a configuration for a sound reproduction system according to a fifth example of the present invention.

FIG. 6 shows a configuration for a sound reproduction system 500 according to a fifth example of the present invention. As is shown in FIG. 6, the sound reproduction system 500 includes an antenna 404 for receiving a television broadcast wave, a decoder 405 for extracting an audio signal from the received broadcast wave, a digital filter 411, a sound volume adjustment circuit 412, a loudspeaker 406, a memory circuit 514, a judgment circuit 513, and a control circuit 515. A monitor system for reproducing image information from the television signal is omitted in FIG. 6.

The memory circuit 514 stores data of amplitude-frequency characteristics patterns that are respectively appropriate for voice signals and non-voice signals (e.g. music signals). The memory circuit 514, also stores sound volume data for ensuring that a perceived sound volume sensed of a given signal adjusted with a specific amplitude-frequency characteristics pattern (i.e. tone-controlled) becomes equal to a perceived sound volume of the signal without such tone control being conducted. The amplitude-frequency characteristics patterns and the corresponding sound volume data are stored in pairs in the memory circuit 514.

The judgment circuit 513 extracts the silent periods of an input audio signal (time intervals in which the amplitude of the input audio signal is smaller than a predetermined level) so as to determine whether the input audio signal is a voice signal or a non-voice signal. The control circuit 515 controls the memory circuit 514 to set the optimum amplitude-frequency characteristics data and sound volume data for the input audio signal.

A broadcast wave which is received by the antenna 404 is supplied to the decoder 405. The decoder 405 extracts an audio signal from the broadcast wave. The extracted audio signal is input to the judgment circuit 513 and the digital filter 411. The judgment circuit 513 extracts the silent periods of the input audio signal. The judgment circuit 513 determines that the input audio signal is a voice signal if the occurrence frequency (number) of the silent periods in a given time interval T is greater than a number N; if such is not the case, the input audio signal is regarded as a non-voice signal (e.g. a music signal). This judgment method is similar to that used in Example 3.

Then, the control circuit 515 controls the memory circuit 514 in accordance with the judgment result, and sets the amplitude-frequency characteristics pattern that is optimum for either voice signals or non-voice signals in the digital filter 411. At the same time, the control circuit 515 sets specific sound volume data in the sound volume adjustment circuit 412, the specific sound volume data being paired up with the data of the amplitude-frequency characteristics pattern set in the digital filter 411. The judgment circuit 513, the control circuit 515, and the memory circuit 514 may be implemented by a microcomputer and a memory, for example.

The digital filter 411 conducts a tone control for the input audio signal so as to realize the amplitude-frequency characteristics set in the digital filter 411. Next, the digital filter 411 outputs a signal to the sound volume adjustment circuit 412. In the sound volume adjustment circuit 412, a sound volume corresponding to the amplitude-frequency characteristics pattern set in the digital filter 411 is set, as is described above. Thus, the output signal of the sound volume adjustment circuit 412 is corrected so as to have a sound volume which a listener 407 feels equal to the sound volume of the signal with no adjustment being conducted for the amplitude-frequency characteristics. The signal output from the sound volume adjustment circuit 412 is reproduced by the loudspeaker 406 so as to be output to the outside as a sound.

As has been described, according to the sound reproduction system 500, the optimum amplitude-frequency characteristics pattern is automatically selected in accordance with the kind of broadcast wave (i.e. whether it is a voice signal or a non-voice signal). The tone and the sound volume of the input audio signal are automatically adjusted accordingly.

EXAMPLE 6

Figure 7:
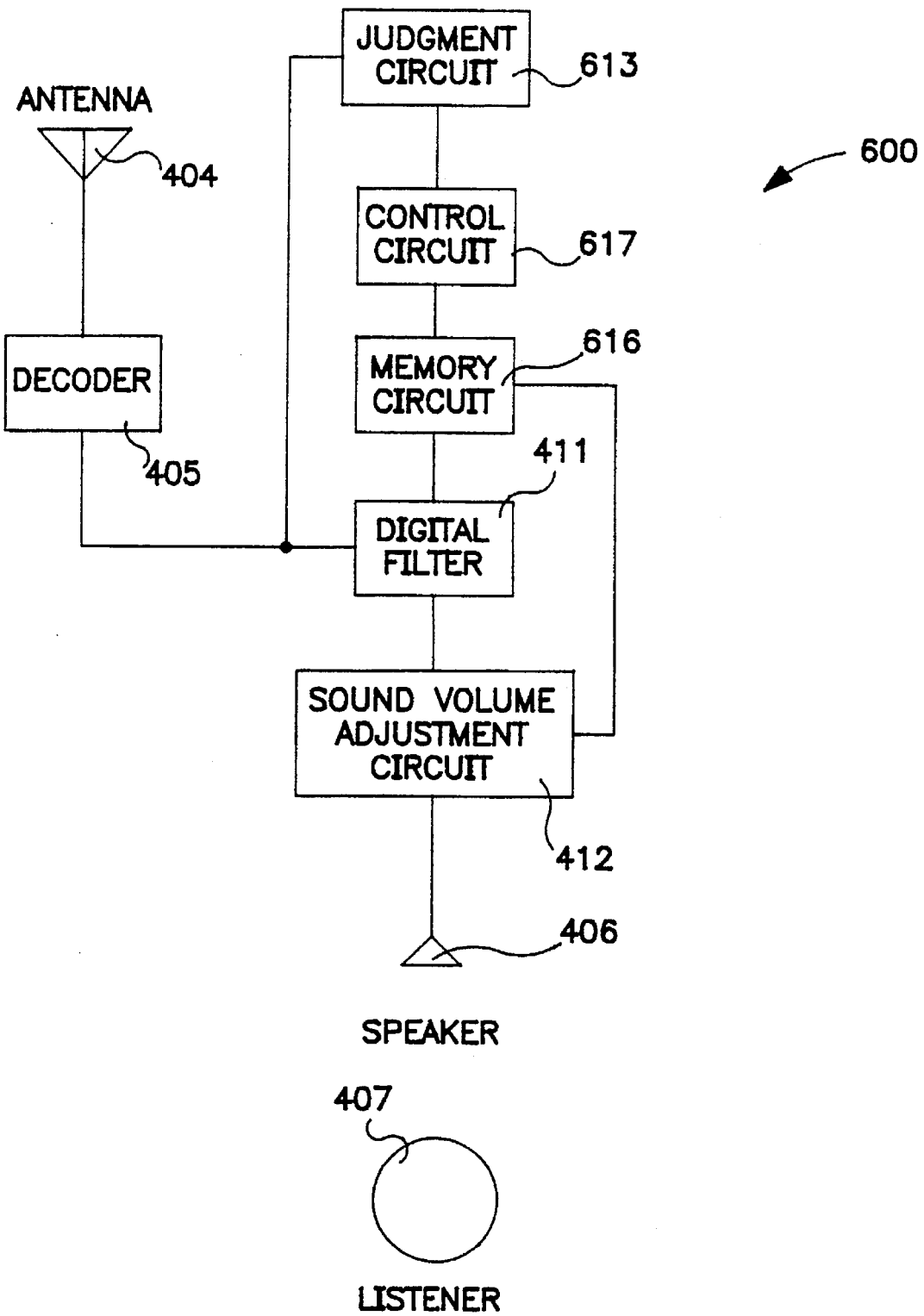
FIG. 7 is a diagram showing a configuration for a sound reproduction system according to a sixth example of the present invention.

FIG. 7 shows a configuration for a sound reproduction system 600 according to a sixth example of the present invention. As is shown in FIG. 7, the sound reproduction system 600 includes an antenna 404 for receiving a television broadcast wave, a decoder 405 for extracting an audio signal from the received broadcast wave, a digital filter 411, a sound volume adjustment circuit 412, a loudspeaker 406, a memory circuit 616, a judgment circuit 613, and a control circuit 617. A monitor system for reproducing image information from the television signal is omitted in FIG. 7.

The memory circuit 616 stores data of an amplitude-frequency characteristics pattern appropriate for voice signals, an amplitude-frequency characteristics pattern appropriate for non-voice signals (e.g., music signals), and a plurality of amplitude-frequency characteristics patterns gradually shifting from the amplitude-frequency characteristics pattern appropriate for voice signals to the amplitude-frequency characteristics pattern appropriate for non-voice signals. The memory circuit 616 stores sound volume data for each amplitude-frequency characteristics pattern, ensuring that a perceived sound volume of a given signal adjusted with a specific amplitude-frequency characteristics pattern (i.e. tone-controlled) becomes equal to a perceived sound volume of the signal without such tone control being conducted. The amplitude-frequency characteristics patterns and the corresponding sound volume data are stored in pairs in the memory circuit 616.

The judgment circuit 613 extracts the silent periods of an input audio signal(time intervals in which the amplitude of the input audio signal is smaller than a predetermined level) so as to determine whether the input audio signal is a voice signal or a non-voice signal. The control circuit 617 controls the memory circuit 616 to gradually set the optimum amplitude-frequency characteristics data and sound volume data for the input audio signal.

The judgment circuit 613, the control circuit 617, and the memory circuit 616 may be implemented by a microcomputer and a memory, for example.

A broadcast wave which is received by the antenna 404 is supplied to the decoder 405. The decoder 405 extracts an audio signal from the broadcast wave. The extracted audio signal is input to the judgment circuit 613 and the digital filter 411. The judgment circuit 613 extracts the silent periods of the input audio signal. The judgment circuit 613 determines that the input audio signal is a voice signal if the occurrence frequency (number) of the silent periods in a given time interval T is greater than a number N; if such is not the case, the input audio signal is regarded as a non-voice signal (e.g. a music signal). This judgment method is similar to that used in Example 3.

Then, the judgment circuit 613 supplies a judgment signal representing the judgment result to the control circuit 617. The control circuit 617 controls the memory circuit 616 in accordance with the judgment result, and sets the amplitude-frequency characteristics pattern that is either optimum for voice signals or non-voice signals in the digital filter 411. At the same time, the control circuit 617 sets the sound volume data which is paired up with the data of the amplitude-frequency characteristics pattern set in the digital filter 411 in the sound volume adjustment circuit 412.

The setting of the amplitude-frequency characteristics and the corresponding sound volume respectively, is gradually conducted at predetermined time intervals in the digital filter 411 and the sound volume adjustment circuit 412,. Hereinafter, the tone control and the sound volume adjustment by the sound reproduction system 600 will be described with reference to FIGS. 8 and 9A to 9E.

Herein, an exemplary case will be described where the data of amplitude-frequency characteristics patterns stored in the memory circuit 616 consists of F1 to F10; F1 is the optimum amplitude-frequency characteristics pattern for voice signals; F10 is the optimum amplitude-frequency characteristics pattern for non-voice signals; F2 to F9 are amplitude-frequency characteristics patterns gradually shifting from F1 to F10; Sound volume data L1 to L10 stored in the memory circuit 616 correspond to the amplitude-frequency characteristics patterns F1 to F10, respectively. In other words, respective pairs of F1 and L1, F2 and L2, . . . , and F10 and L10 are stored in the memory circuit 616. FIGS. 9A to 9E schematically show examples of F1, F3, F5, F7, and F10. The present invention provides no limitation to the patterns of amplitude-frequency characteristics. It is also applicable to prepare a plurality of sets of amplitude-frequency characteristics patterns in the memory circuit 616.

Consider a case where the judgment circuit 613 determines that the input audio signal is a voice signal. It is further assumed that an amplitude-frequency characteristics pattern F10 for non-voice signals has been set in the digital filter 411. The tone control and the sound volume adjustment are gradually conducted so as to finally arrive at the amplitude-frequency characteristics pattern F1 (and sound volume L1), in the following manner:

After the input audio signal is determined to be voice signal, the control circuit 617 sets data F9 and L9 that are stored in the memory circuit 616 in the digital filter 411 and the sound volume adjustment circuit 412, respectively. Then, after a time interval $t_2$, the control circuit 617 sets data F8 and L8 in the digital filter 411 and the sound volume adjustment circuit 412, respectively, and so on. A time amount $T_2$ which is required for changing the data from F10 to F1 (L10 to L1) is prescribed to be longer than a time interval $T_1$ for determination by the control circuit 617 of whether the input audio signal is a voice signal or a non-voice signal. Thus, a smooth tone control is achieved. In addition, the listener 407 does not feel disturbed even when a misjudgment has been made as to whether the input audio signal is a voice signal or a non-voice signal.

Figure 8:
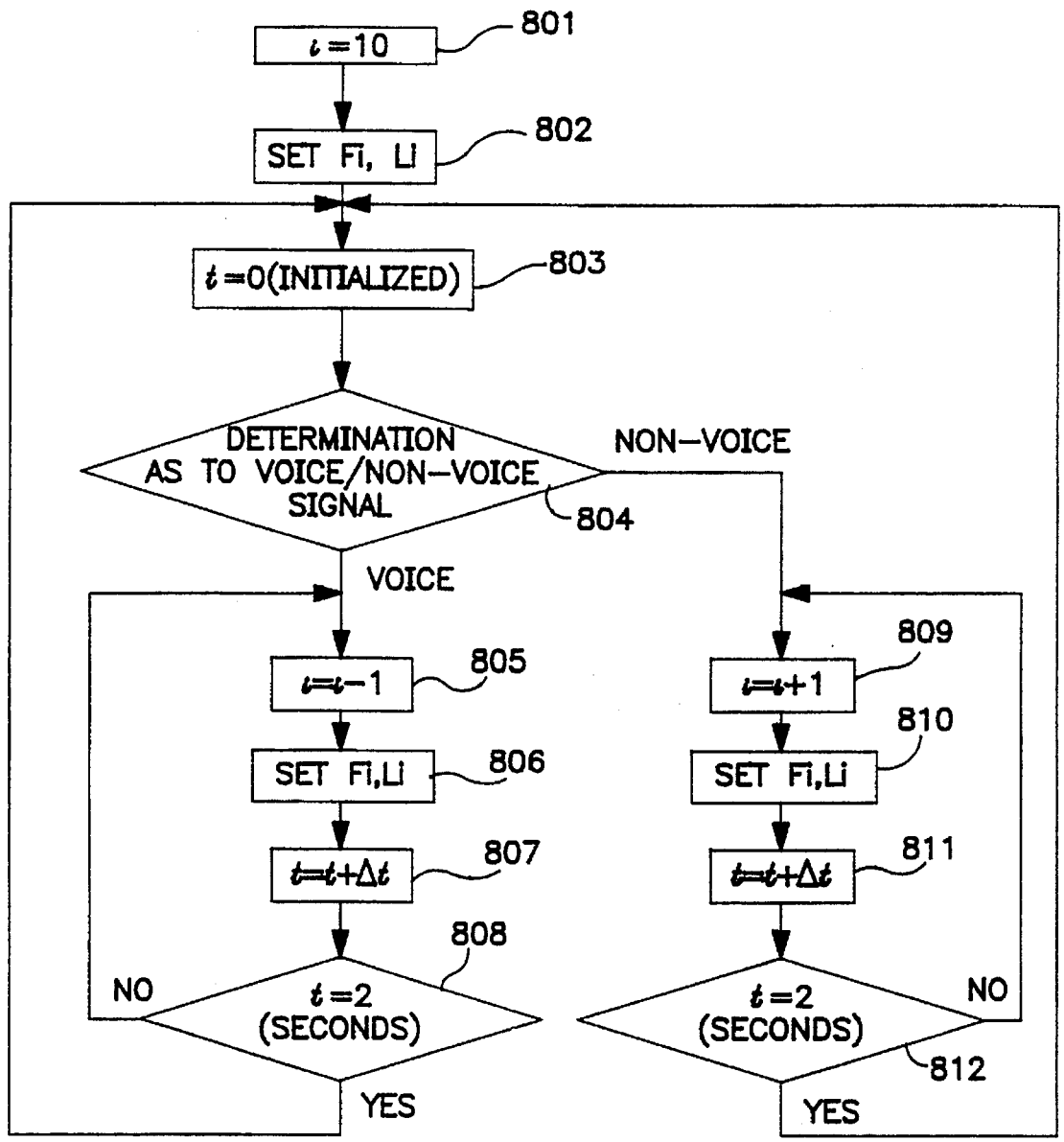
FIG. 8 is a diagram schematically showing a tone control and a sound volume control for a sound reproduction system according to a sixth example of the present invention.
Figure 9A:
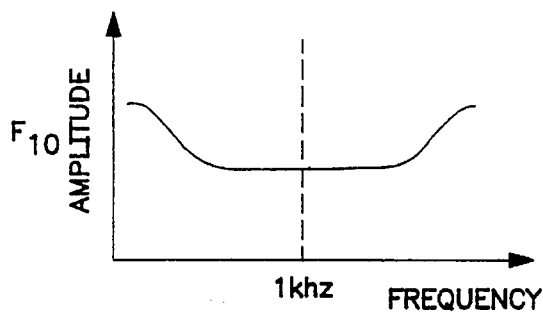
FIGS. 9A to 9E are diagrams showing exemplary amplitude-frequency characteristics patterns.
Figure 9B:
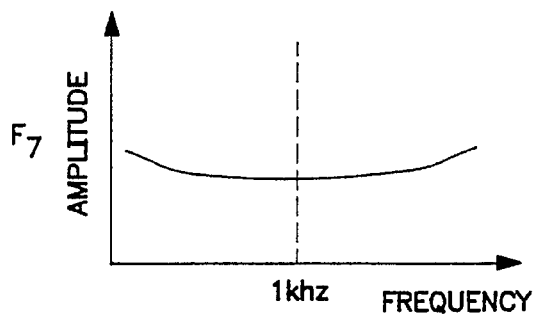
Figure 9C:
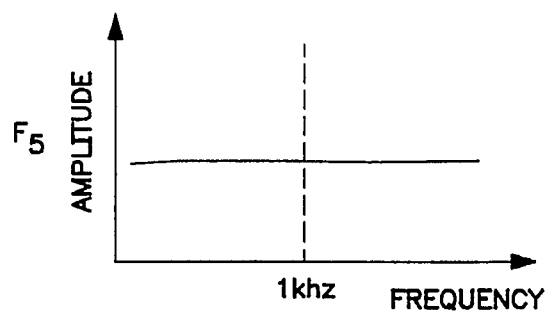
Figure 9D:
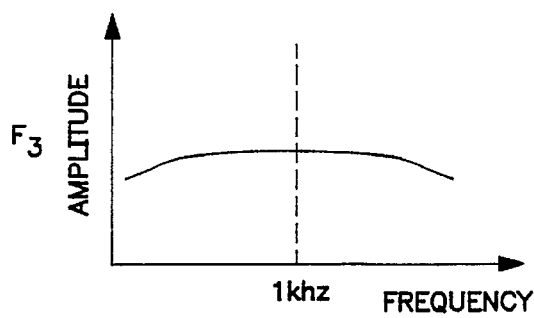
Figure 9E:
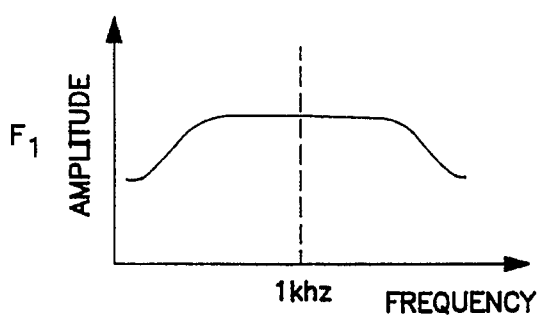
Figure 10:
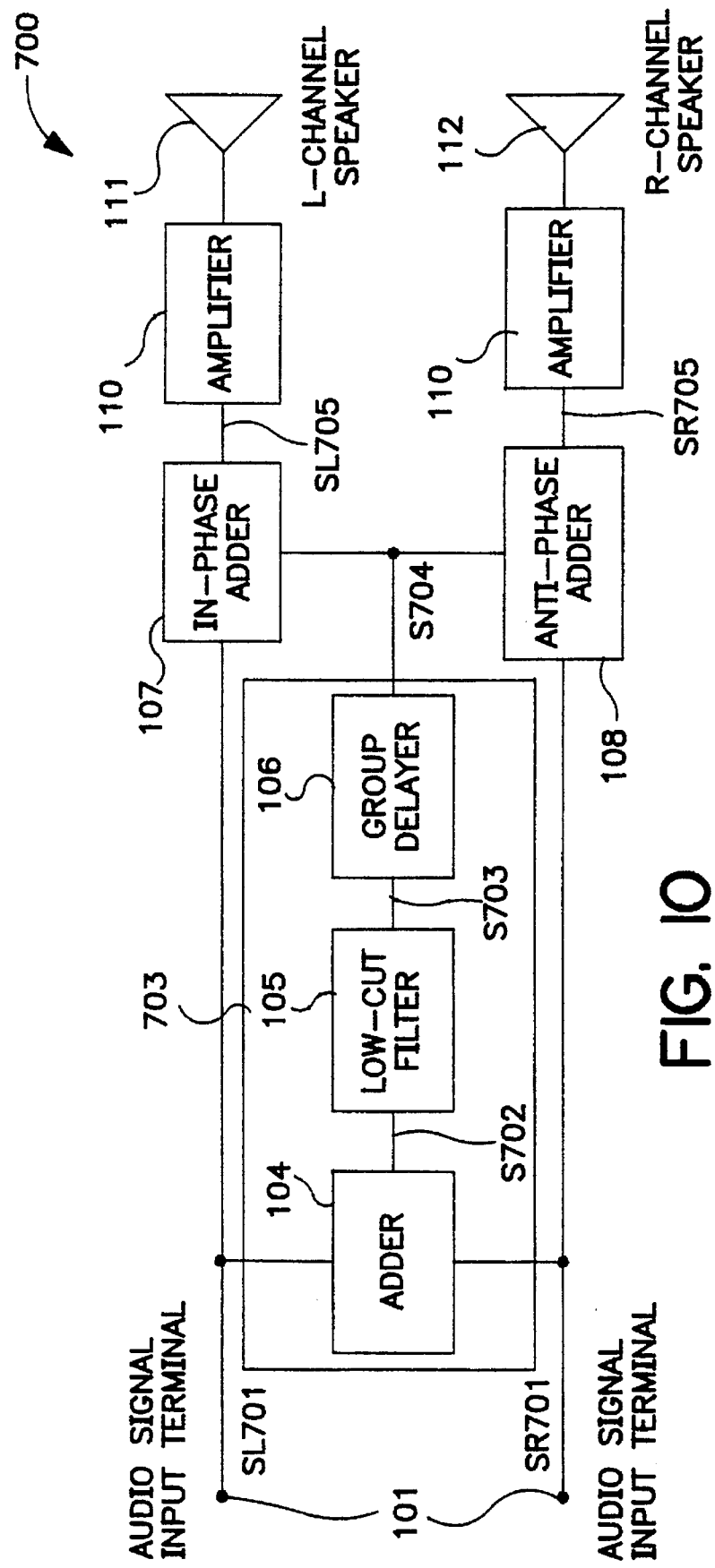
FIG. 10 is a diagram showing a configuration for a conventional sound reproduction system.
Figure 11:
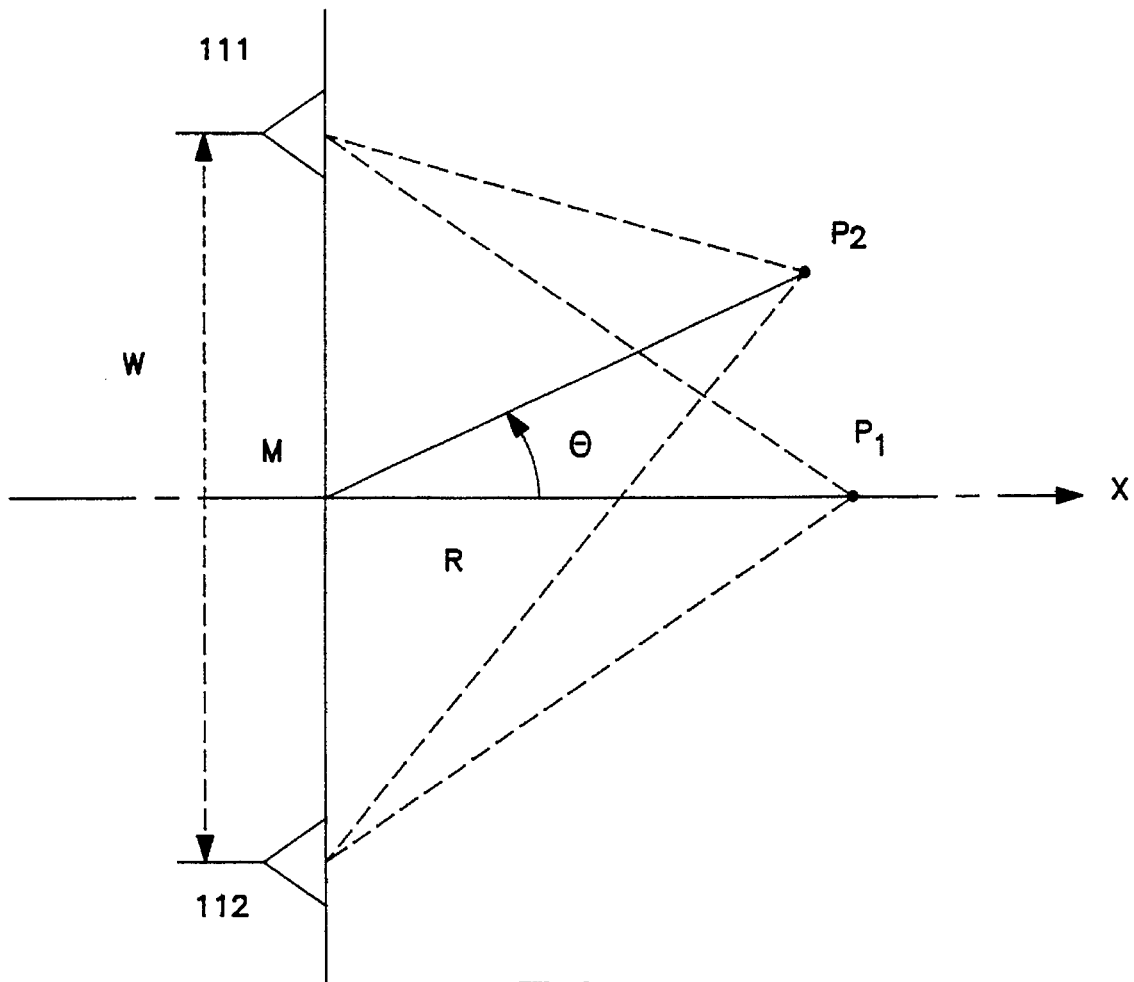
FIG. 11 is a diagram showing an arrangement of the measurement points for measuring transmission characteristics.
Figure 13A:
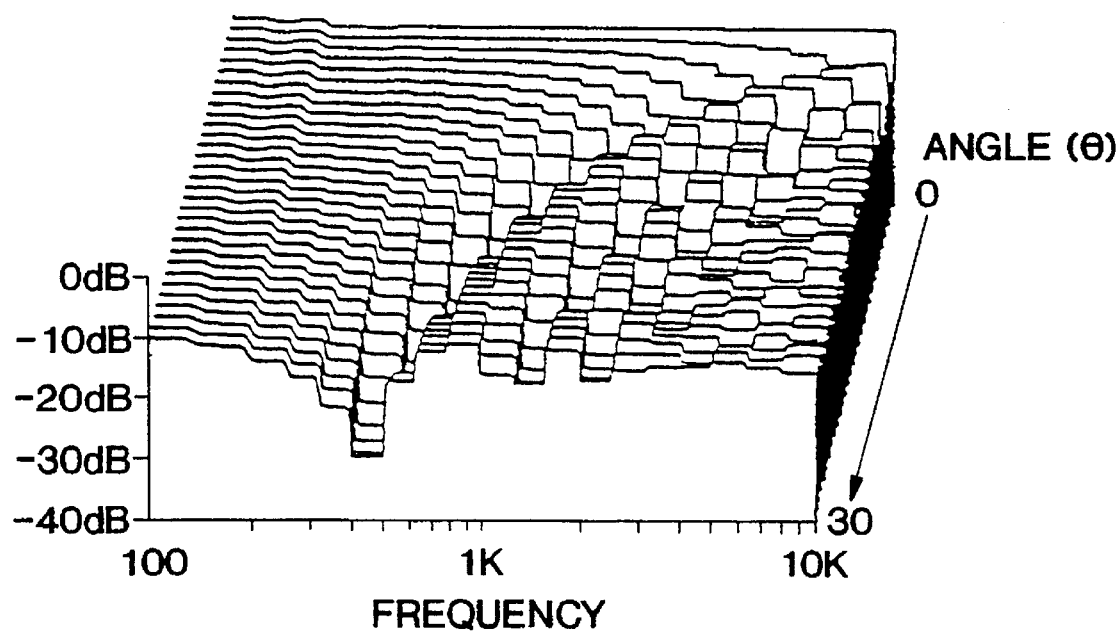
FIGS. 13A and 13B are diagrams showing transmission characteristics depending on the angle of the listening position.
Figure 13B:
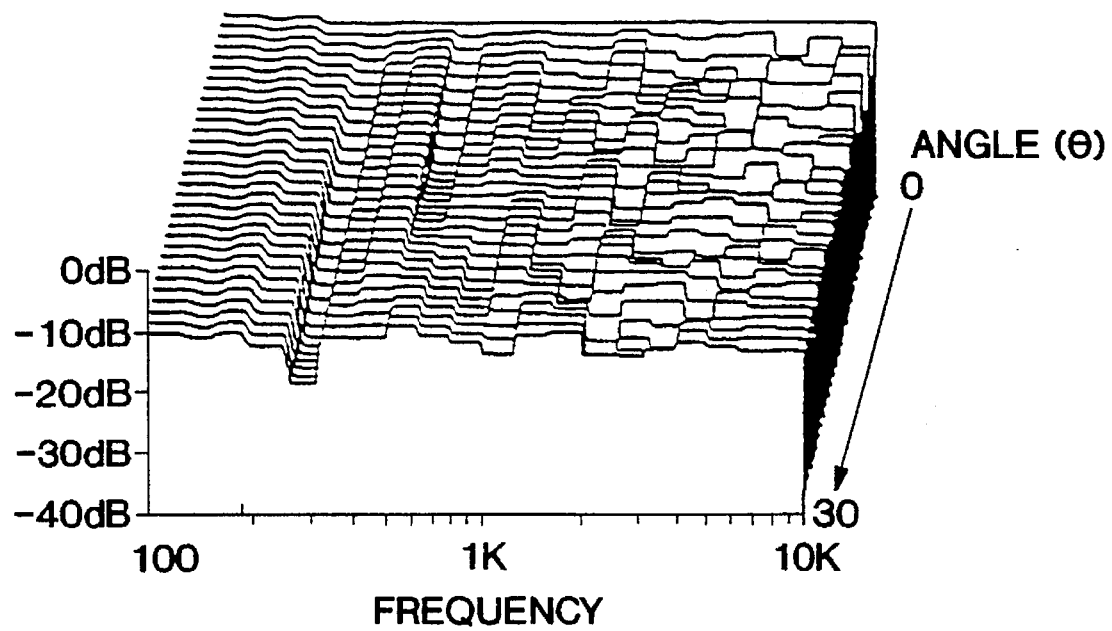
Figure 14A:
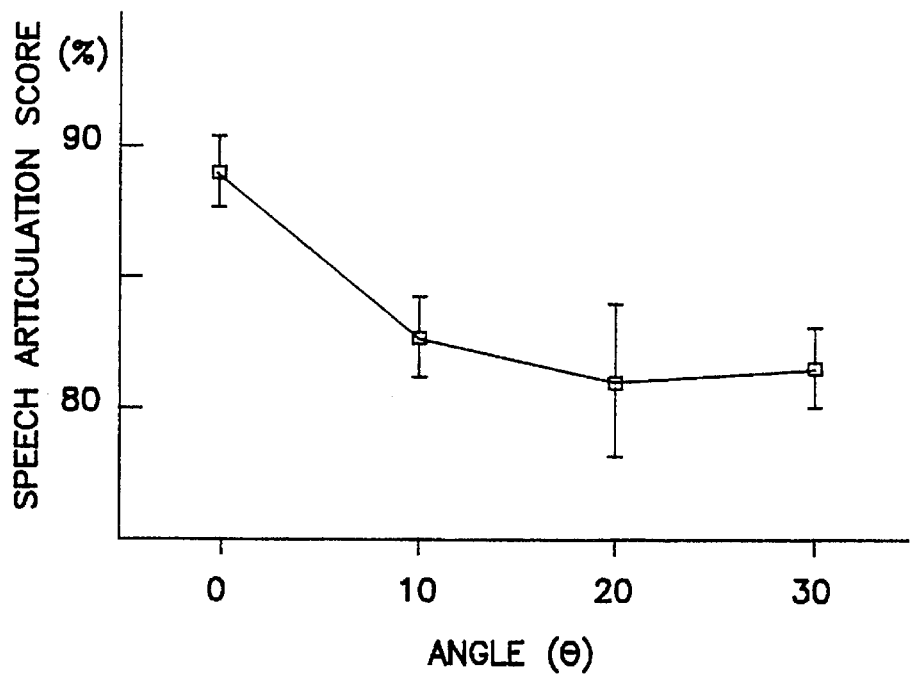
FIGS. 14A and 14B are diagrams showing monosyllable articulation scores.
Figure 14B:
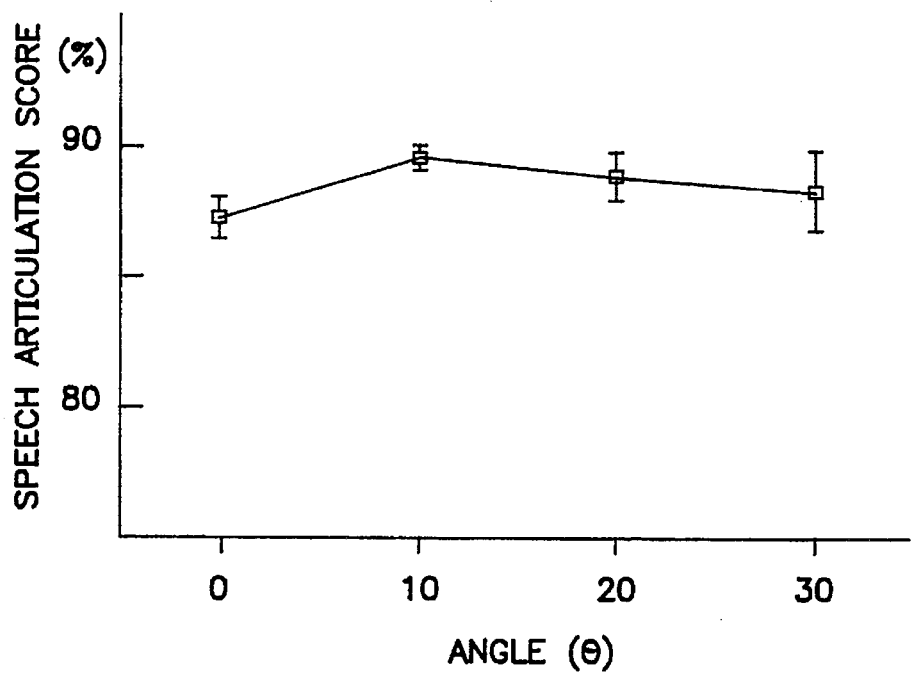
Figure 15:
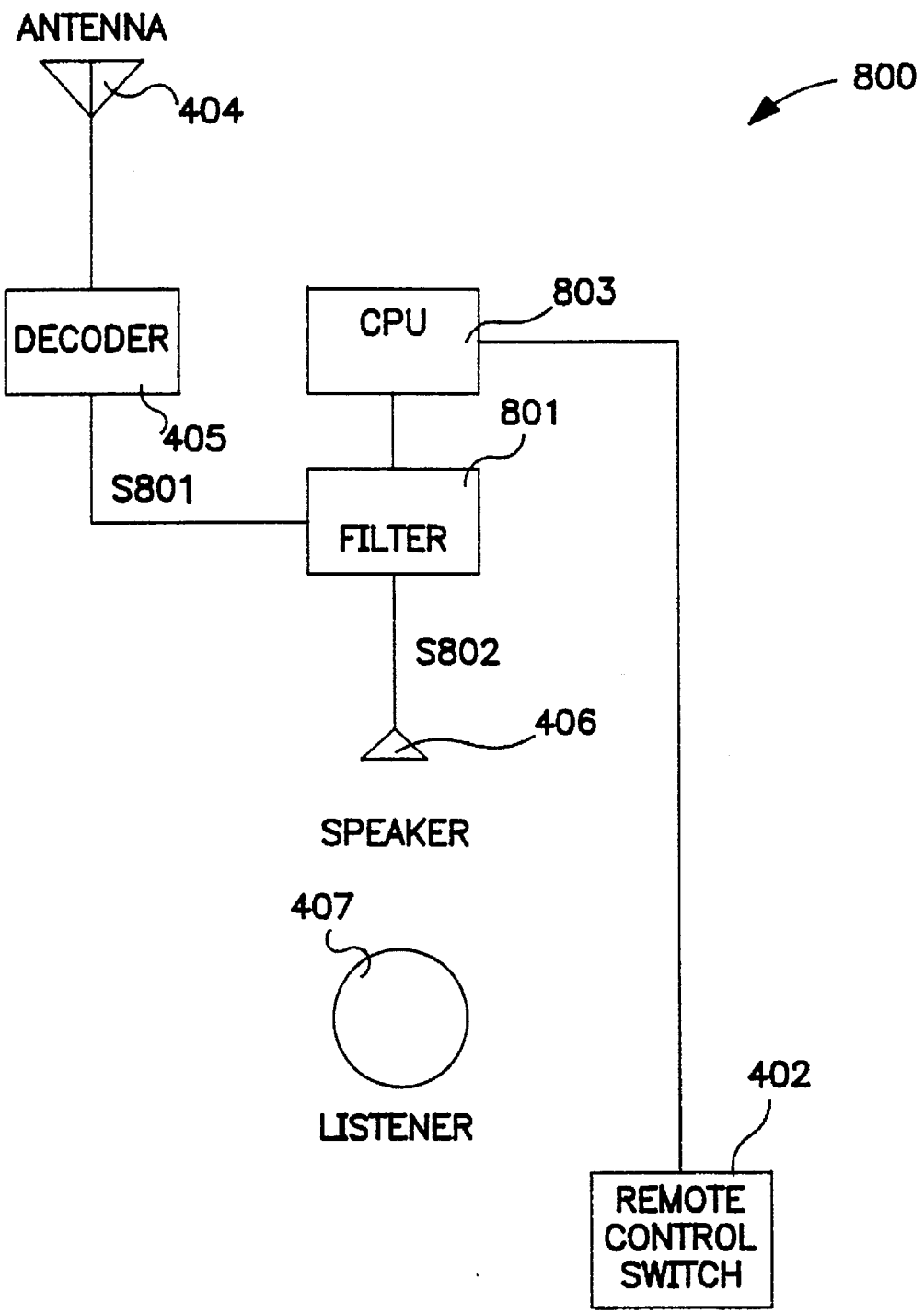
FIG. 15 is a diagram showing a configuration for another conventional sound reproduction system.
Figure 16A:
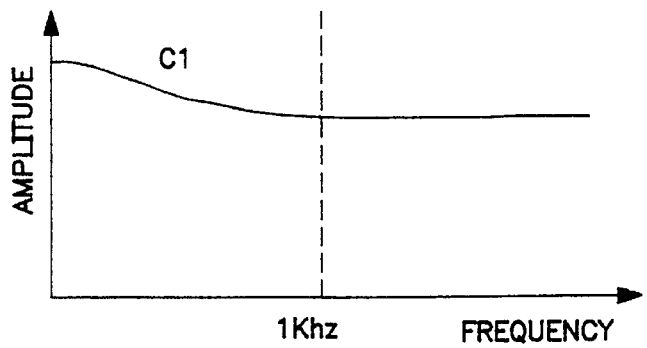
FIGS. 16A to 16D are diagrams showing amplitude-frequency characteristics of a filter used for a tone control process.
Figure 16B:
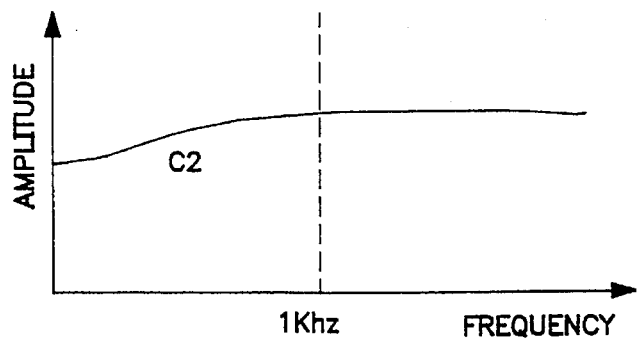
Figure 16C:
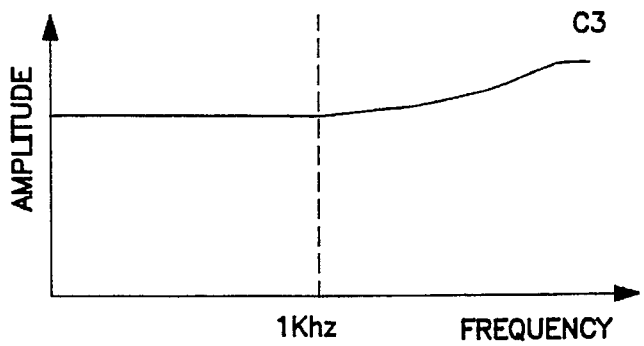
Figure 16D:
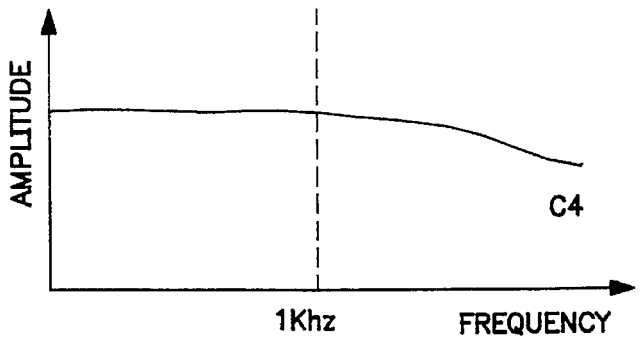

FIG. 8 is a flow chart schematically showing the above-mentioned adjustment procedure. Assuming that the amplitude-frequency characteristics pattern F10 has been set in the digital filter 411 and that the sound volume data L1 is set in the sound volume adjustment circuit 412 (step 801 and 802), the following tone control and sound volume adjustment are made. First, the time t representing the timings at which the determinations are conducted is initialized (step 803), and the judgment circuit 613 conducts a first determination (step 804). If the input audio signal is determined to be a voice signal, the control circuit 617 sets the data F9 and L9, which are stored in the memory circuit 617, in the digital filter 411 and the sound volume adjustment circuit 412, respectively (step 806, i=9). After a time interval t (step 807), the data F8 and L8 are set in the digital filter 411 and the sound volume adjustment circuit 412 (step 806, i=8). Such an operation is repeated until t equals 2 (see).

When equals 2, the time t is initialized again (step 803), a second determination is conducted. If the second judgment proves, as well as the first judgment, that the input signal is a voice signal, steps 805 to 808 are repeated again, until the data F1 and L1 for voice signals are set. On the other hand, if the second judgment proves that the input signal is a non-voice signal, steps 809 to 812 are repeated instead of steps 805 to 808, so that the data F1 and L1 for non-voice signals are set. Such an operation avoids drastic changes in the tone, thereby making the tone control smooth. In addition, even if the first judgment were a misjudgment, the error can be corrected without allowing the listener 407 to feel disturbed, since the adjustment procedure is reversed at an intermediate step so that the data for non-voice signals (F10 and L10) can be set again instead of finally setting the data for voice-signals (F1 and L1).

In the present example, the adjustment time interval $T_2$ is made twice as long as the judgment time interval $T_1$. For example, if the judgment time interval $T_1$ is 2 seconds, as is described above, the control circuit 617 shifts the data from F10 to F1 over a time period of 4 seconds. Accordingly, in the case where the input audio signal changes from a non-voice to a voice signal and again changes to a non-voice signal while the judgment circuit 613 makes three judgments, the amplitude-frequency characteristics change from F10 to F6 and again to F10 at time intervals of 2 seconds. Therefore, the listener 407 feels no major change in the tone, as compared with the cases where the data is shifted from F10 to F1 or F1 to F10 without conducting a gradual control therebetween. Thus, the tone and the sound volume can be adjusted without allowing the listener 407 to feel disturbed due to a drastic change in the tone even when the input audio signal drastically changes from a voice signal to a non-voice signal, or vice versa.

When the amplitude-frequency characteristics pattern is set, as in the above-mentioned examples, the digital filter 411 adjusts the tone of the input audio signal so as to realize the amplitude-frequency characteristics set in the digital filter 411. The signal output from the sound volume adjustment circuit 412 is reproduced by the loudspeaker 406 so as to be output to the outside as a sound.

As has been described, according to the present invention, the ratio between the stereophonic signal component and the monophonic signal component in an audio signal is judged by means of a judgment circuit. In accordance with the judgment result thus obtained, the addition ratios of the processed signal and the input audio signal are adjusted so as to reproduce the sound contained in the input signal. As a result, uniform transmission characteristics are automatically achieved for both a monophonic signal and a center signal component contained in a stereophonic signal, irrespective of the listening position of the listener.

Moreover, according to the present invention, it is determined whether input audio signals are stereophonic signals or monophonic signals by using a control signal for judging whether the received television broadcast wave is a stereophonic broadcast or a monophonic broadcast. In accordance with this control signal, the addition ratios of the output signal from a signal processing section and the input audio signal are adjusted so as to reproduce the sound contained in the input signal. As a result, uniform transmission characteristics are automatically achieved for both a monophonic signal and a center signal component contained in a stereophonic signal, irrespective of the listening position of the listener.

Moreover, according to the present invention, addition ratios of the input audio signals and the processed output signals are gradually varied in accordance with the judgment result by the judgment circuit, misjudgments are avoided, and the listener is allowed to recognize only a smooth change in the reproduced sound.

Moreover, according to the present invention, it is determined whether an input audio signal is a voice signal or a non-voice signal by a judgment circuit. Based on the judgment result, the addition ratios of the output signal from a signal processing section and the input audio signal are adjusted so as to reproduce the sound contained in the input signal. As a result, uniform transmission characteristics are automatically achieved for a signal containing a voice signal, and a high speech articulation score is achieved for a voice signal.

Moreover, according to the present invention, when an input audio signal is subjected to a tone control, the sound volume is also adjusted corresponding to an amplitude-frequency characteristics pattern used in a tone control circuit, concurrently with the tone control. As a result, changes in the total volume due to the tone control are minimized, thereby making the tone control sound smooth to the ears of the listener.

Furthermore, according to the present invention, it is determined whether an input audio signal is a voice signal or a non-voice signal by a judgment circuit. Based on the judgment result, the tone is adjusted by the tone control circuit which uses the optimum amplitude-frequency characteristics pattern for the input audio signal. In addition, a sound volume circuit adjusts the sound volume corresponding to the selected amplitude-frequency characteristics pattern. As a result, the total sound volume of the tone-controlled signal is perceived as the same as that before the tone control was conducted. Thus, the optimum tone control for the input audio signal is automatically conducted in accordance with the kind of input audio signal, while substantially eliminating changes in the total sound volume due to the tone control.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A sound reproduction system for automatically conducting a tone control and a sound volume adjustment for an audio signal, the sound reproduction system comprising:

input means for inputting an audio signal;

judging means for receiving the input audio signal and for determining whether the input audio signal is a voice signal or a non-voice signal so as to output a judgment signal;

tone control means for adjusting amplitude-frequency characteristics of the input audio signal in accordance with a judgment result by the judgment means and for generating an output signal;

sound volume adjustment means for receiving the output signal and for adjusting sound volume of the output signal in accordance with a tone control conducted by the tone control means;

memory means for storing data of a first amplitude-frequency characteristics pattern for the voice signal, a second amplitude-frequency characteristics pattern for the non-voice signal, and a plurality of amplitude-frequency characteristics patterns gradually shifting from the first amplitude-frequency characteristics pattern to the second amplitude-frequency characteristics pattern, and data of sound volumes corresponding to the respective amplitude-frequency characteristics patterns, wherein in the first amplitude-frequency characteristics pattern, the amplitudes at lower and higher frequency ranges are lower than the amplitude at a central frequency, and in the second amplitude-frequency characteristics pattern, the amplitudes at lower and higher frequency ranges are higher than the amplitude at the central frequency;

control means for receiving the judgment signal and controlling the tone control means by generating a control signal for selecting the data of amplitude-frequency characteristics patterns stored in the memory means so as to gradually conduct a tone control at predetermined time intervals until receiving a next judgment signal, and for controlling the sound volume adjustment means by generating a control signal for selecting the data of sound volume stored in the memory means corresponding to the selected data of amplitude-frequency characteristics patterns so as to adjust the sound volume corresponding to respective gradual steps of the tone control; and output means for receiving the output signal from the sound volume adjusting means and for reproducing the output signal.

2. A sound reproduction method for automatically conducting a tone control and a sound volume adjustment for an audio signal, the sound reproduction method comprising the steps of:

inputting an audio signal;

judging the input audio signal and determining whether the input audio signal is a voice signal or a non-voice signal so as to output a judgment signal;

controlling the tone of the input audio signal by adjusting amplitude-frequency characteristics of the input audio signal based on the judgment signal and generating an output signal;

adjusting the sound volume of the output signal in accordance with a tone control conducted in the step of controlling the tone of the input audio signal;

storing data of a first amplitude-frequency characteristics pattern for the voice signal, a second amplitude-frequency characteristics pattern for the non-voice signal, and a plurality of amplitude-frequency characteristics patterns gradually shifting from the first amplitude-frequency characteristics pattern to the second amplitude-frequency characteristics pattern, and data of sound volumes corresponding to the respective amplitude-frequency characteristics patterns in memory means, wherein in the first amplitude-frequency characteristics pattern, the amplitudes at lower and higher frequency ranges are lower than the amplitude at a central frequency, and in the second amplitude-frequency characteristics pattern, the amplitudes at lower and higher frequency ranges are higher than the amplitude at the central frequency;

receiving the judgment signal and controlling the step of controlling the tone of the input audio signal by generating a control signal for selecting the data of amplitude-frequency characteristics patterns stored in the memory means so as to gradually conduct a tone control at predetermined time intervals until receiving a next judgment signal, and controlling the step of adjusting the sound volume of the output signal by generating a control signal for selecting the data of sound volume stored in the memory means corresponding to the selected data of amplitude-frequency characteristics patterns so as to adjust the sound volume corresponding to respective gradual steps of the tone control; and reproducing the output signal.

* * * * *